United States Patent
Lin et al.

(10) Patent No.: US 11,404,480 B2
(45) Date of Patent: Aug. 2, 2022

(54) MEMORY ARRAYS INCLUDING CONTINUOUS LINE-SHAPED RANDOM ACCESS MEMORY STRIPS AND METHOD FORMING SAME

(71) Applicant: Taiwan Semiconductor Manufacturing Company, Ltd., Hsinchu (TW)

(72) Inventors: Yi-Tzu Lin, Taichung (TW); Kuo-Chyuan Tzeng, Chu-Pei (TW); Kao-Chao Lin, Fanlu Township (TW); Chang-Chih Huang, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 109 days.

(21) Appl. No.: 16/727,051

(22) Filed: Dec. 26, 2019

(65) Prior Publication Data
US 2021/0202579 A1    Jul. 1, 2021

(51) Int. Cl.
| H01L 27/24 | (2006.01) |
| H01L 27/22 | (2006.01) |
| H01L 43/08 | (2006.01) |
| H01L 43/12 | (2006.01) |
| H01L 45/00 | (2006.01) |

(52) U.S. Cl.
CPC ........ *H01L 27/2463* (2013.01); *H01L 27/222* (2013.01); *H01L 43/08* (2013.01); *H01L 43/12* (2013.01); *H01L 45/06* (2013.01); *H01L 45/1253* (2013.01); *H01L 45/146* (2013.01); *H01L 45/1608* (2013.01); *H01L 45/1675* (2013.01); *H01L 45/1683* (2013.01)

(58) Field of Classification Search
CPC ... H01L 27/2463; H01L 27/222; H01L 43/08; H01L 43/12; H01L 45/06; H01L 45/1253; H01L 45/146; H01L 45/1608; H01L 45/1675; H01L 45/1683
USPC ............................................................ 257/4
See application file for complete search history.

(56) References Cited

U.S. PATENT DOCUMENTS

| 9,257,486 B2 | 2/2016 | Lin |
| 9,299,747 B1 | 3/2016 | Pellizzer et al. |
| 10,403,681 B2 | 9/2019 | Ahn et al. |
| 10,475,853 B2 | 11/2019 | Lee et al. |
| 2008/0303013 A1* | 12/2008 | Happ .................... H01L 45/144 257/3 |

(Continued)

FOREIGN PATENT DOCUMENTS

| JP | 2018164085 A | 10/2018 |
| KR | 20160061876 A | 6/2016 |

(Continued)

*Primary Examiner* — Jami Valentine Miller
(74) *Attorney, Agent, or Firm* — Slater Matsil, LLP

(57) ABSTRACT

A device includes a first plurality of conductive strips have lengthwise directions in a first direction, a selector array overlapping the first plurality of conductive strips, an electrode array overlapping the selector array, a plurality of memory strips over the electrode array, and a second plurality of conductive strips overlapping the plurality of memory strips. The plurality of memory strips and the second plurality of conductive strips have lengthwise directions in a second direction perpendicular to the first direction.

20 Claims, 20 Drawing Sheets

(56) References Cited

U.S. PATENT DOCUMENTS

| | | | |
|---|---|---|---|
| 2009/0097299 A1* | 4/2009 | Tanaka | H01L 27/10 365/145 |
| 2010/0019217 A1 | 1/2010 | Kim et al. | |
| 2012/0225534 A1 | 9/2012 | Lee et al. | |
| 2012/0267597 A1* | 10/2012 | Lung | H01L 45/085 257/4 |
| 2014/0077150 A1* | 3/2014 | Ho | H01L 27/2481 257/5 |
| 2017/0173262 A1* | 6/2017 | Veltz | A61B 5/0022 |
| 2017/0294483 A1 | 10/2017 | Terai et al. | |
| 2020/0098779 A1* | 3/2020 | Cernea | H01L 27/11568 |
| 2020/0411754 A1* | 12/2020 | Ruiz | H01L 45/1675 |
| 2021/0202579 A1* | 7/2021 | Lin | H01L 27/2463 |

FOREIGN PATENT DOCUMENTS

| | | |
|---|---|---|
| KR | 20170059971 A | 5/2017 |
| KR | 20180094155 A | 8/2018 |

\* cited by examiner

MEMORY ARRAYS INCLUDING CONTINUOUS LINE-SHAPED RANDOM ACCESS MEMORY STRIPS AND METHOD FORMING SAME

BACKGROUND

In integrated circuit (IC) devices, resistive random access memory (RRAM) is a technology for non-volatile memory devices. Generally, RRAM use a dielectric material, which although normally insulating, can be made to conduct through a filament or conduction path formed after the application of a specific voltage. Once the filament is formed, it may be set (i.e., re-formed, resulting in a lower resistance across the RRAM) or reset (i.e., broken, resulting in a high resistance across the RRAM) by applying appropriate voltages. The low and high resistance states can be utilized to indicate a digital signal of "1" or "0" depending upon the resistance state, and thereby provide a non-volatile memory cell that can store a bit.

From an application point of view, RRAM has many advantages. RRAM has a simple cell structure and CMOS logic comparable processes, which result in a reduction of the manufacturing complexity and cost in comparison with other non-volatile memory structures. Despite the attractive properties noted above, a number of challenges exist.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
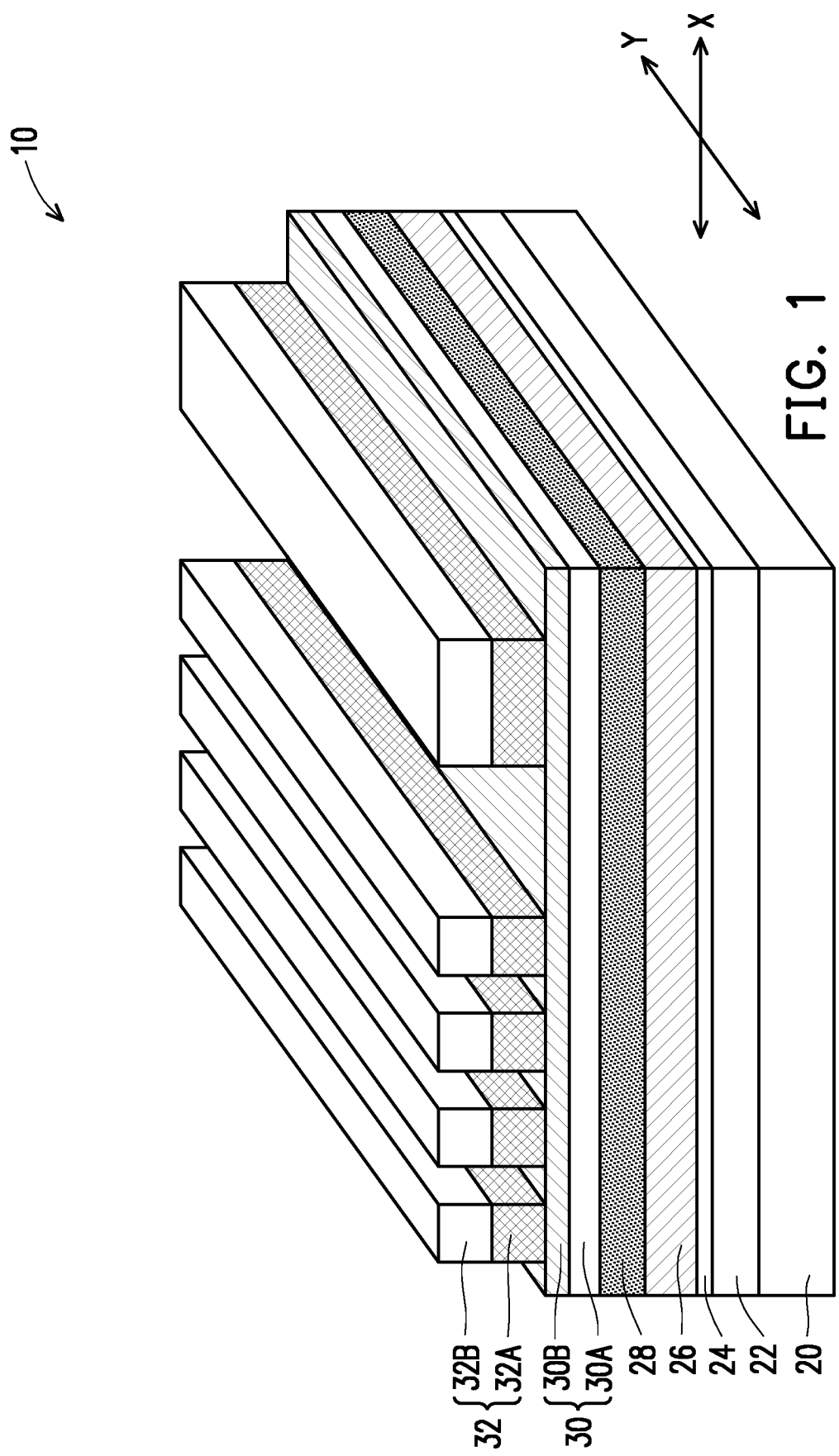
FIGS. 1-6, 7A, 7B, and 7C illustrate the perspective views and cross-sectional views of intermediate stages in the formation of Random Access Memory (RAM) cells in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Random Access Memory (RAM) cells and arrays and the method of forming the same are provided in accordance with some embodiments. Some variations of some embodiments are discussed. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

In accordance with some embodiments of the present disclosure, a memory array includes a plurality of memory cells arranged as a plurality of rows and columns. The state-storage elements (also referred to as bit-storage elements) of a plurality of RAM cells in the same row (or the same column) of the RAM array are parts of a same continuous strip, which continuous strip is not separated into discrete pieces through patterning. Accordingly, in the patterning of the RAM cells for forming columns, the state-storage element strips are not patterned. With the state-storage element strips patterned in a single direction rather than two directions, it is possible to achieve smaller sizes for the RAM array, and gap-filling process is easier.

Figure 18:
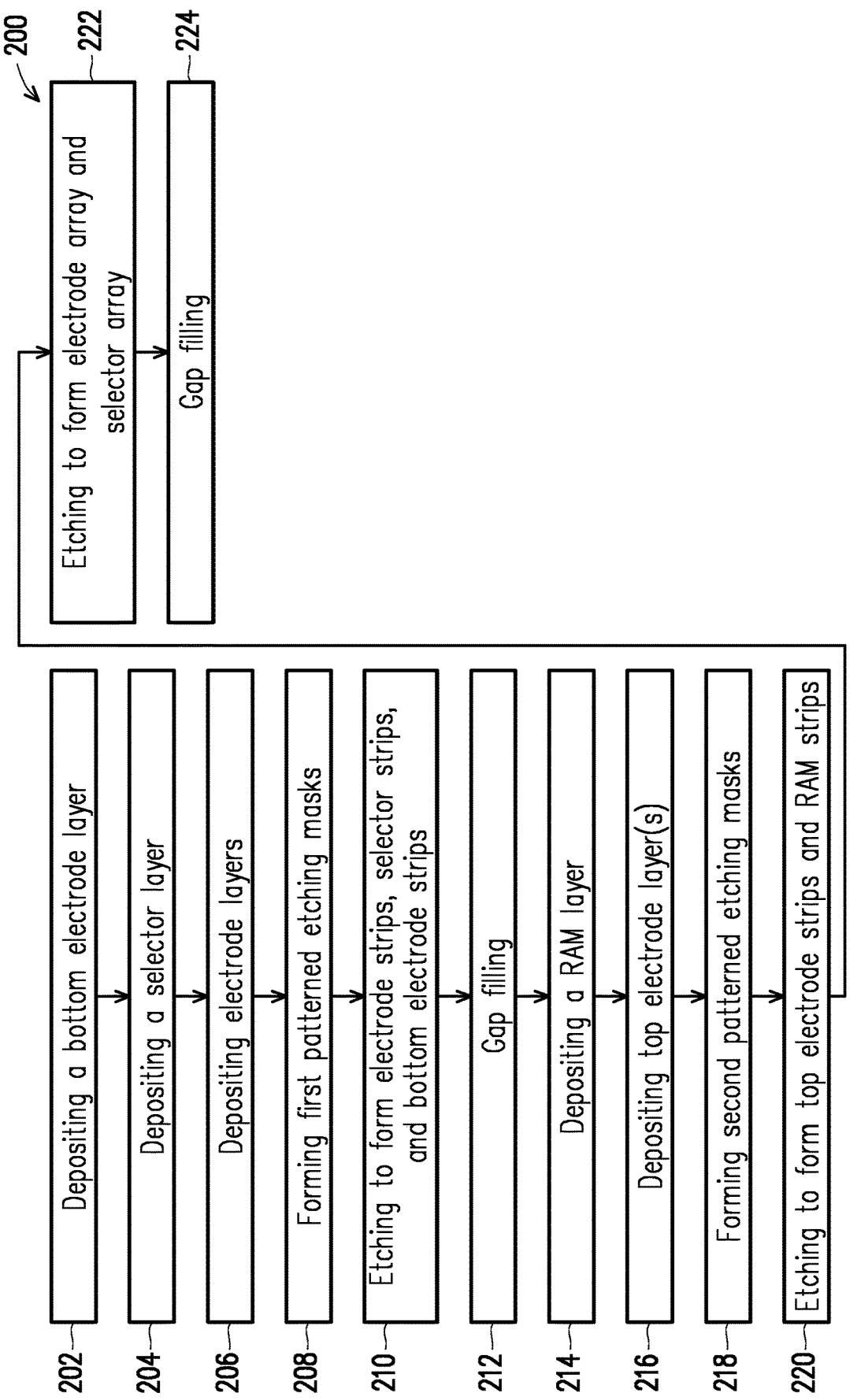
FIG. 18 illustrates a process flow for forming RAM cells in accordance with some embodiments.

FIGS. 1 through 7A illustrate the perspective views and cross-sectional views of intermediate stages in the formation of a RAM array in accordance with some embodiments of the present disclosure. The corresponding processes are also reflected schematically in the process flow shown in FIG. 18.

In FIG. 1, base structure 20, which is a part of wafer 10, is provided. Base structure 20 may be or comprise a substrate. The substrate may be a semiconductor substrate, such as a bulk semiconductor substrate, a Semiconductor-On-Insulator (SOI) substrate, or the like. The semiconductor substrate in base structure 20 may be doped (e.g., with a p-type or an n-type dopant) or undoped. The semiconductor substrate may be a part of semiconductor wafer such as a silicon wafer. An SOI substrate is a layer of a semiconductor material formed on an insulator layer. The insulator layer may be, for example, a Buried Oxide (BOX) layer, a silicon oxide layer, or the like. The insulator layer is formed on a substrate, typically a silicon substrate or a glass substrate. Other substrates such as a multi-layered or gradient substrate may also be used. In accordance with some embodiments, the semiconductor material of the semiconductor substrate may include silicon; germanium; a compound semiconductor including silicon carbide, gallium arsenic, gallium phosphide, indium phosphide, indium arsenide, and/or indium antimonide; an alloy semiconductor including SiGe, SiC, GaAsP, AlInAs, AlGaAs, GaInAs, GaInP, and/or GaInAsP;

or combinations thereof. The substrate in base structure may also be formed of other materials such as sapphire, Indium tin oxide (ITO), or the like. In accordance with alternative embodiments, the substrate in base structure 20 is a dielectric substrate, which may be, for example, a silicon oxide substrate. Also, base structure 20 may include the vias 25 (FIG. 16) that are to be underlying and contacting the bottom electrode strips (which may be word lines) to be formed in the subsequent processes.

Base structure 20 may also include additional layers and devices including, and not limited to, dielectric layers, metal features, or the like. For example, there may be an inter-layer dielectric, inter-metal dielectrics (which may include low-k dielectric layers), and/or the like. There may be, or may not be, integrated circuit devices such as passive devices (capacitors, resistors, inductors, and/or the like) and/or active devices (transistors, diodes, and/or the like) formed in base structure 20, which devices may be formed based on the substrate in wafer 10.

Dielectric layer 22 may be formed over base structure 20. In accordance with some embodiments of the present disclosure, dielectric layer 22 is formed of silicon oxide, silicon nitride, silicon oxynitride, silicon oxycarbide, or the like, combinations thereof, and/or multi-layers thereof. When vias 25 (FIG. 16) are to be formed, vias 25 extend into dielectric layer 22.

In accordance with some embodiments, etch stop layer 24 is formed over dielectric layer 22. Etch stop layer 24 may also be formed of or comprise a dielectric material, which may be silicon oxide, aluminum oxide, silicon nitride, silicon oxynitride, silicon oxycarbide, or the like, or combinations thereof. In accordance with alternative embodiments, etch stop layer 24 is not formed, and the subsequently formed bottom electrode layer 26 is in contact with dielectric layer 22. Dielectric layer 22 and etch stop layer 24 may be formed using Plasma Enhanced Chemical Vapor Deposition (PECVD), Chemical Vapor Deposition (CVD), Atomic Layer Deposition (ALD), or the like.

Over etch stop layer 24 (or dielectric layer 22 if etch stop layer 24 is not formed), bottom electrode layer 26 is deposited. The respective process is illustrated as process 202 in the process flow 200 shown in FIG. 18. Bottom electrode layer 26 is an electrically conductive layer. In accordance with some embodiments, bottom electrode layer 26 is formed of or comprises a metal, which may be tungsten, titanium, cobalt, nickel, and/or alloys thereof. The formation methods may include Physical Vapor Deposition (PVD), ALD, CVD, or the like. Bottom electrode layer may be a single layer, or may include a plurality of layers formed of different materials.

Selector layer 28 is then deposited over bottom electrode layer 26. The respective process is illustrated as process 204 in the process flow 200 shown in FIG. 18. Selector layer 28 may include a plurality of layers formed of different materials. Selector layer 28 is subsequently patterned to form selectors (28" as in FIG. 7A), which may be turned on or off to pass or cut off currents, respectively, depending on the bias voltages of the respective selectors. The selectors are capable of delivering high drive currents. In addition, the non-linearity factor (or rectification factor or on/off ratio) is high, for example, higher than about 1,000 to enable the formation of large memory arrays with high density. In accordance with some embodiments of the present disclosure, selector layer 28 has a P/N junction structure, with a p-type semiconductor layer in contact with an n-type semiconductor layer, so that a P/N junction is formed. Selector layer 28 may also have a metal/semiconductor/insulator/semiconductor/metal (M/S/I/S/M) structure or a metal/low-bandgap-dielectric/insulator/low-bandgap-dielectric/metal (M/l/I/l/M) structure. For example, selector layer 28 may include a TiN/α-Si/Si-rich-SiN/α-Si/TiN stack, a TiAlN/α-Si/Si-rich-SiN/α-Si/TiAlN stack, a TiN/α-Si/N-doped-Si/α-Si/TiN stack, a TiAlN/α-Si/N-doped-Si/α-Si/TiAlN stack, or the like.

Electrode layer(s) 30 is deposited over selector layer 28. The respective process is illustrated as process 206 in the process flow 200 shown in FIG. 18. Electrode layer 30 is a conductive layer, which may be or comprise a metal. It is appreciated that since each of the selector layer 28 and the subsequently deposited state-storage layer may have different structures and formed of different materials, electrode layer 30 may also have multiple choices of different structures and different materials to suit to the overlying state-storage layer. In accordance with some embodiments, electrode layer 30 comprises an adhesion layer 30A and metal layer 30B. In accordance with some embodiments, adhesion layer 30A comprises titanium, tantalum, titanium nitride, tantalum nitride, or the like, or alloys thereof. Metal layer 30B may be formed of or comprise platinum (Pt), iridium (Ir), gold (Au), tungsten (W), titanium-nitride (TiN), or the like. Electrode layer 30 may be an inert layer when Conductive Bridging Random Access Memories (CBRAMs) are to be formed. Alternatively, metal layer 30B may be an active layer, and may be formed of copper or silver, or the like.

In accordance with some embodiments, bottom electrode layer 26, selector layer 28, and electrode layer 30 are deposited as blanket layers. Next, etching masks 32 are formed over electrode layer 30. The respective process is illustrated as process 208 in the process flow 200 shown in FIG. 18. In accordance with some embodiments of the present disclosure, etching masks 32 include hard masks 32A and photo resist 32B over hard masks 32A. The formation processes may include blanket depositing a hard mask layer, applying and patterning photo resist 32B through lithography, and then etching the hard mask layer to form hard mask 32A.

Figure 2:
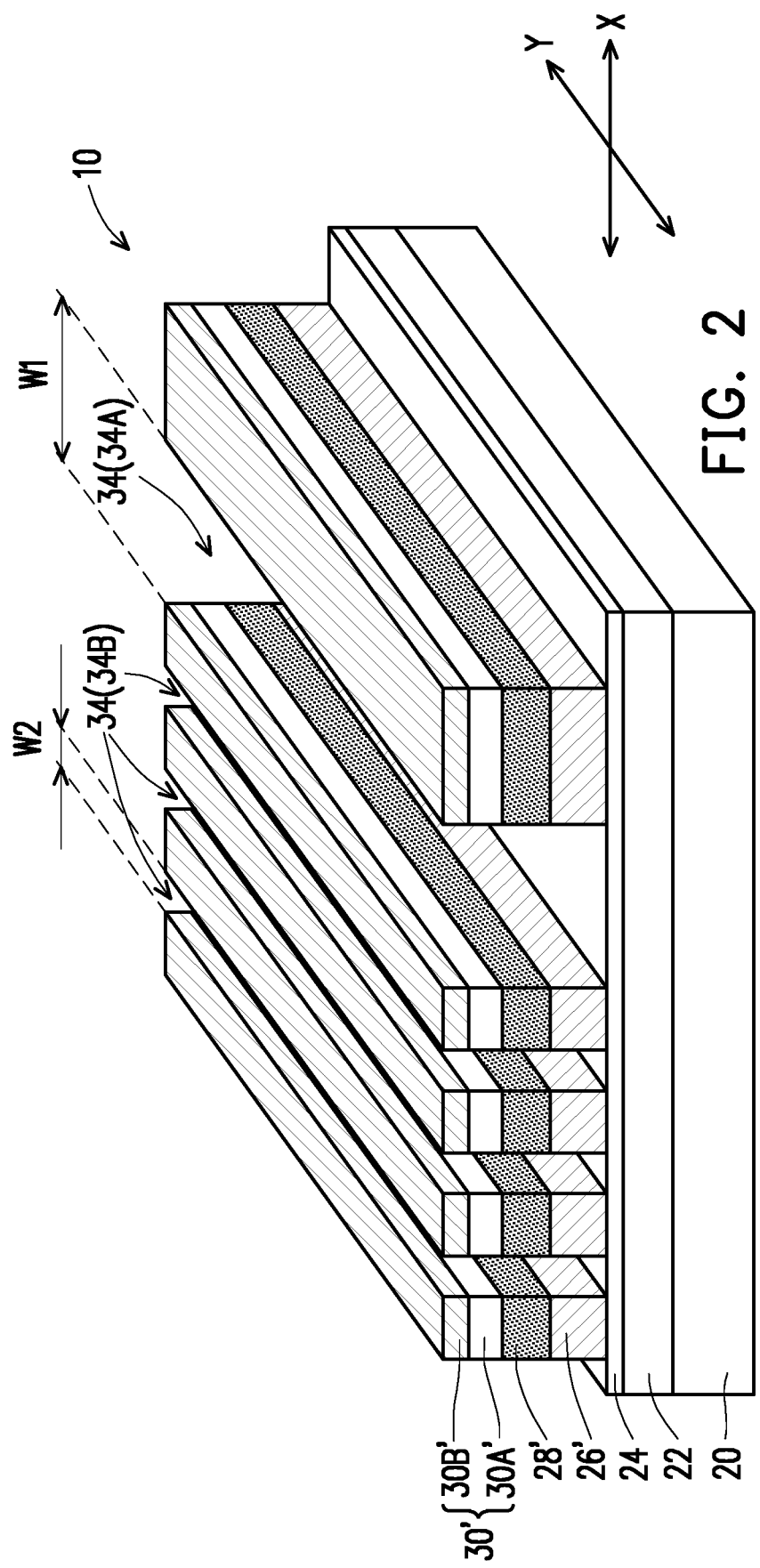

Electrode layer 30, selector layer 28, and bottom electrode layer 26 are etched using etching masks 32. The respective process is illustrated as process 210 in the process flow 200 shown in FIG. 18. After the etching process, etching mask 32 is removed. In the etching process, etch stop layer 24 or dielectric layer 22 (if etch stop layer 24 is not formed) may be used for stopping the etching process. As a result of the etching process, a plurality of strips are formed, which include bottom electrode strips 26', selector strips 28', and electrode strips 30' (including electrode strips 30A' and 30B'), as illustrated in FIG. 2. Bottom electrode strips 26', selector strips 28', and electrode strips 30' are elongated strips having lengthwise directions in the Y-direction. Wide strips and narrow strips are illustrated as examples to show that memories with different specifications and sizes may be formed simultaneously. The plurality of strips are separated from each other by gaps 34. The strips have lengthwise directions in the Y-direction. In accordance with some embodiments, the Y-direction is referred to as the row direction, and X-direction is referred to as the column direction. It is appreciated, however, that the "row direction" and "column direction" are relative terms, and are interchangeable, depending on the direction in which the structure is viewed. Gaps 34 are formed between the patterned strips. In accordance with some embodiments, gaps 34 may include wide gaps 34A with width W1 and narrow gaps 34B with width W2. For example, ratio W1/W2 may be greater than about 1.5, and may be in the range between about 2 and about 5 in accordance with some embodiments, wherein width W1 is the width of a wider gap 34, and width W2 is the width of a narrow gap 34. In accordance with some embodiments of the present disclosure, gaps 34 have a uniform width.

Figure 3:
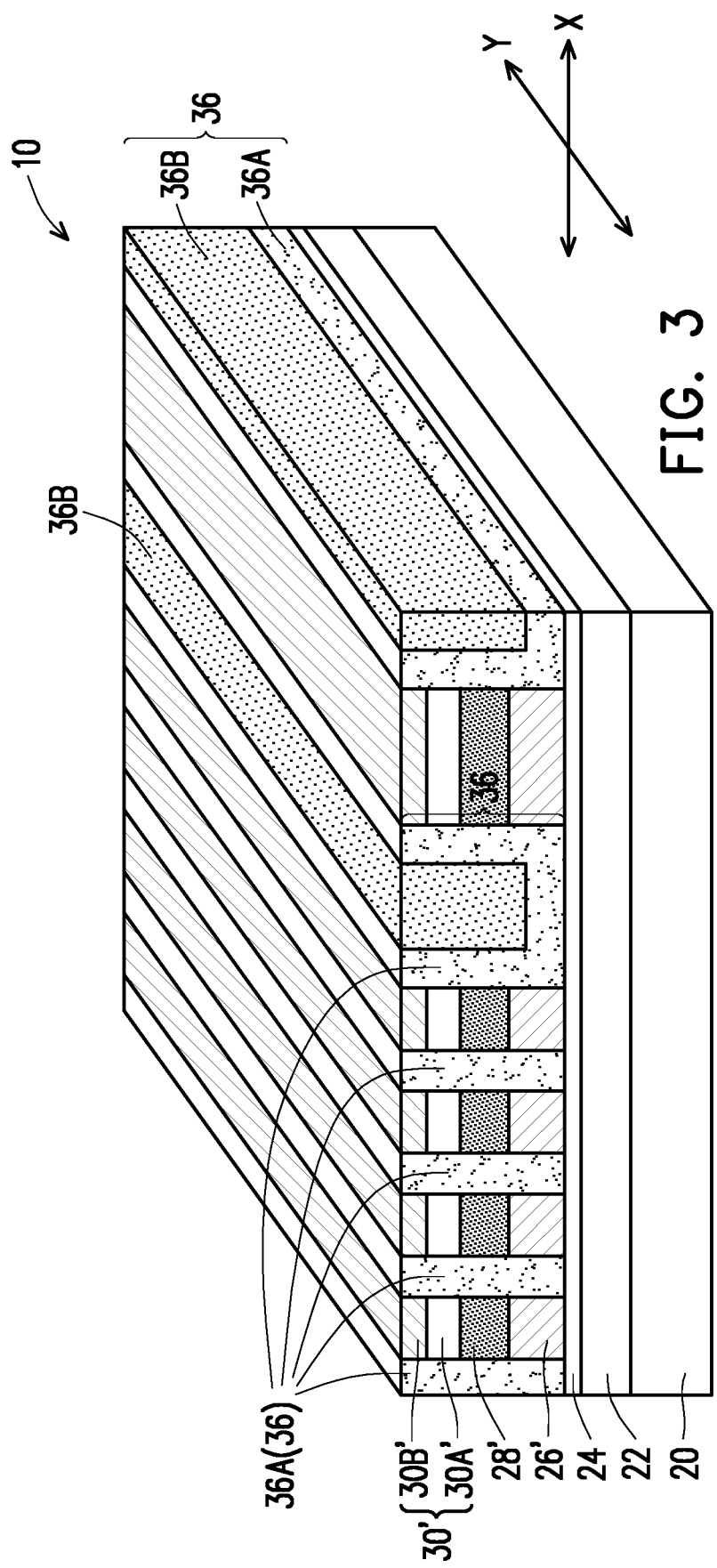

The gaps 34 are then filled in a gap-filling process, and the resulting gap-filling regions 36 are shown in FIG. 3. The respective process is illustrated as process 212 in the process flow 200 shown in FIG. 18. In accordance with some embodiments, the gap-filling process includes depositing one or a plurality of dielectric layers, and then performing a planarization process such as a Chemical Mechanical Polish (CMP) process or a mechanical grinding process to remove excess portions of the deposited dielectric material(s). Metal layer 30B may act as a polish stop layer in the planarization process. In accordance with some embodiments, gap-filling regions 36 comprise dielectric layers 36A and 36B. Dielectric layer 36A may be formed of a material having good adhesion to bottom electrode strips 26', selector strips 28', and electrode strips 30', and may be formed using a conformal deposition method such as ALD. Dielectric layer 36B may be formed of a material having a good gap-filling property, which can fill the gaps without leaving voids. For example, Dielectric layer 36A may be formed of or comprise silicon nitride, and dielectric layer 36B may be formed of or comprise silicon oxide.

In accordance with some embodiments, as shown in FIG. 3, dielectric layer 36A fully fills the narrow gaps 34B (FIG. 2), and partially fills the wide gaps 34A. Accordingly, the gap-filling regions 36 in narrow gaps 34B are free from dielectric layer 36B. On the other hand, the gap-filling regions 36 in wide gaps 34A may include both of dielectric layers 36A and 36B.

Figure 4:
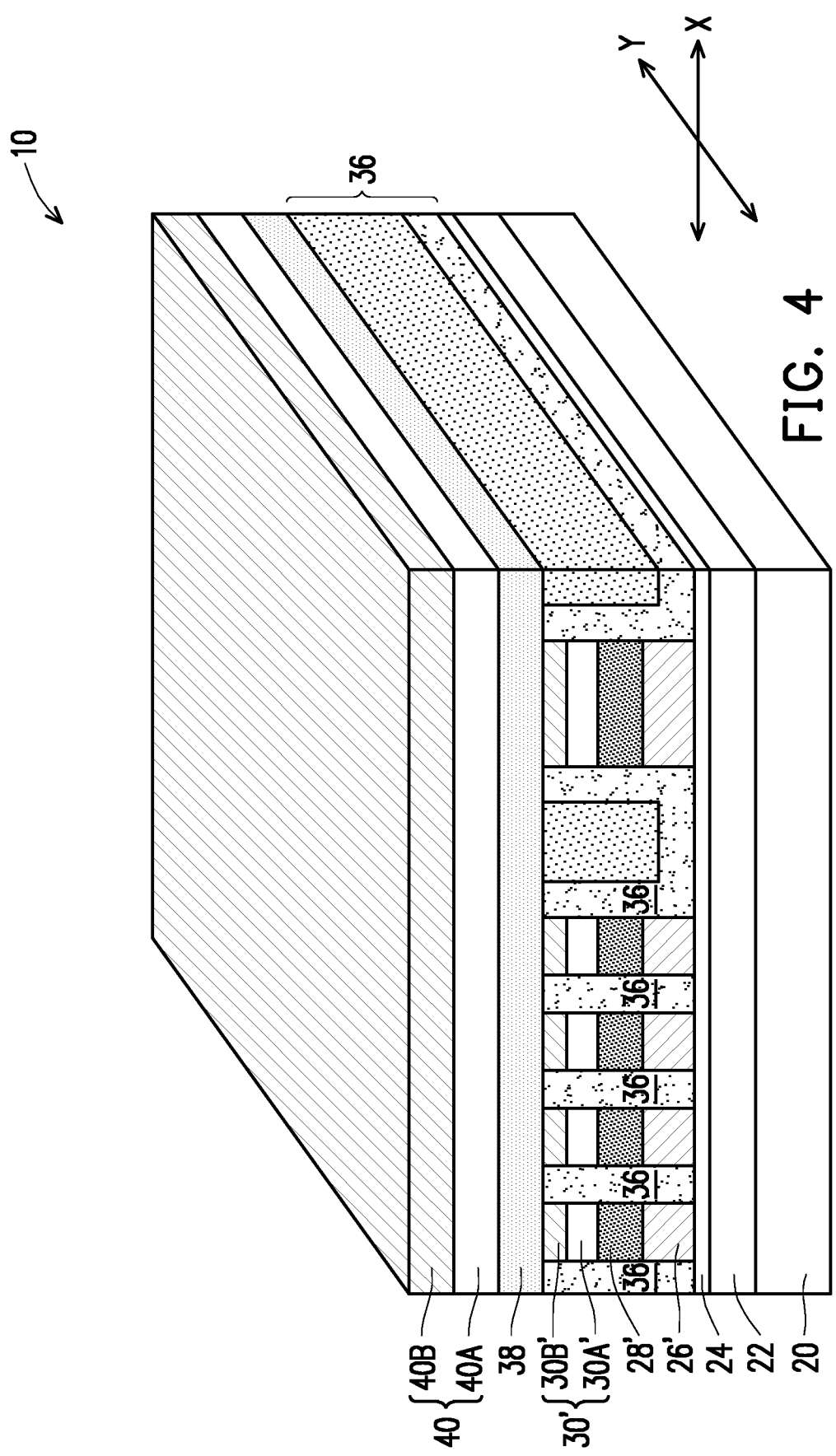

FIG. 4 illustrates the formation of state-storage layer 38. Throughout the description, state-storage layer 38 is also referred to as RAM layer 38 or memory layer 38. The respective process is illustrated as process 214 in the process flow 200 shown in FIG. 18. In accordance with some embodiments, RAM layer 38 is formed of a material(s) that is used for forming memories including, and not limited to, Resistive Random Access Memories (RRAMs), Conductive Bridging Random Access Memories (CBRAMs), magneto-Resistive Random Access Memories (MRAMs), Phase-Change Random Access Memories (PCRAMs), Ferroelectric Random Access Memories (FeRAMs), or the like. Accordingly, RAM layer 38 may include a single or a plurality of layers, and depending on the type of the RAMs to be formed, the single or the plurality of layers may have the appropriate structure and materials. For example, when the respective RAMs to be formed are CBRAMs, RAM layer 38 may be formed of a solid electrolyte material, in which conductive filaments may be formed. The solid electrolyte material may be formed of a chalcogenide material such as, but not limited to, $GeSb_2Te_5$. Alternatively, the solid electrolyte material is a metal oxide material such as, but not limited to, hafnium oxide.

In another example, when the respective RAMs to be formed are PCRAMs, RAM layer 38 may include a heating layer and a phase change layer. The heating layer may be a thin layer formed of TiN, TaN, TiSiN, TiAlN, TiCN, or combinations thereof, which is configured to generate enough heat to raise the temperature of the neighboring phase change layer. The phase change layer may be formed of or comprise GeSbTe, for example. The formation methods of the RAM layer 38 may include CVD, PECVD, Metal Organic Chemical Vapor Deposition (MOCVD), and/or the like, depending on the materials of the layers in RAM layer 38.

FIG. 4 further illustrates the formation of top electrode layer 40. The respective process is illustrated as process 216 in the process flow 200 shown in FIG. 18. Top electrode layer 40 is a conductive layer, which may be or comprise a metal layer. In accordance with some embodiments, top electrode layer 40 comprises adhesion layer 40A and metal layer 40B. In accordance with some embodiments, adhesion layer 40A comprises titanium, tantalum, titanium nitride, tantalum nitride, tungsten, or the like, or alloys thereof. Metal layer 40B may also be formed of or comprise tungsten, copper, silver, nickel, platinum, iridium, gold, or the like. Top electrode layer 40 may act the active electrode or inert electrode when CBRAMs are to be formed.

Figure 5:
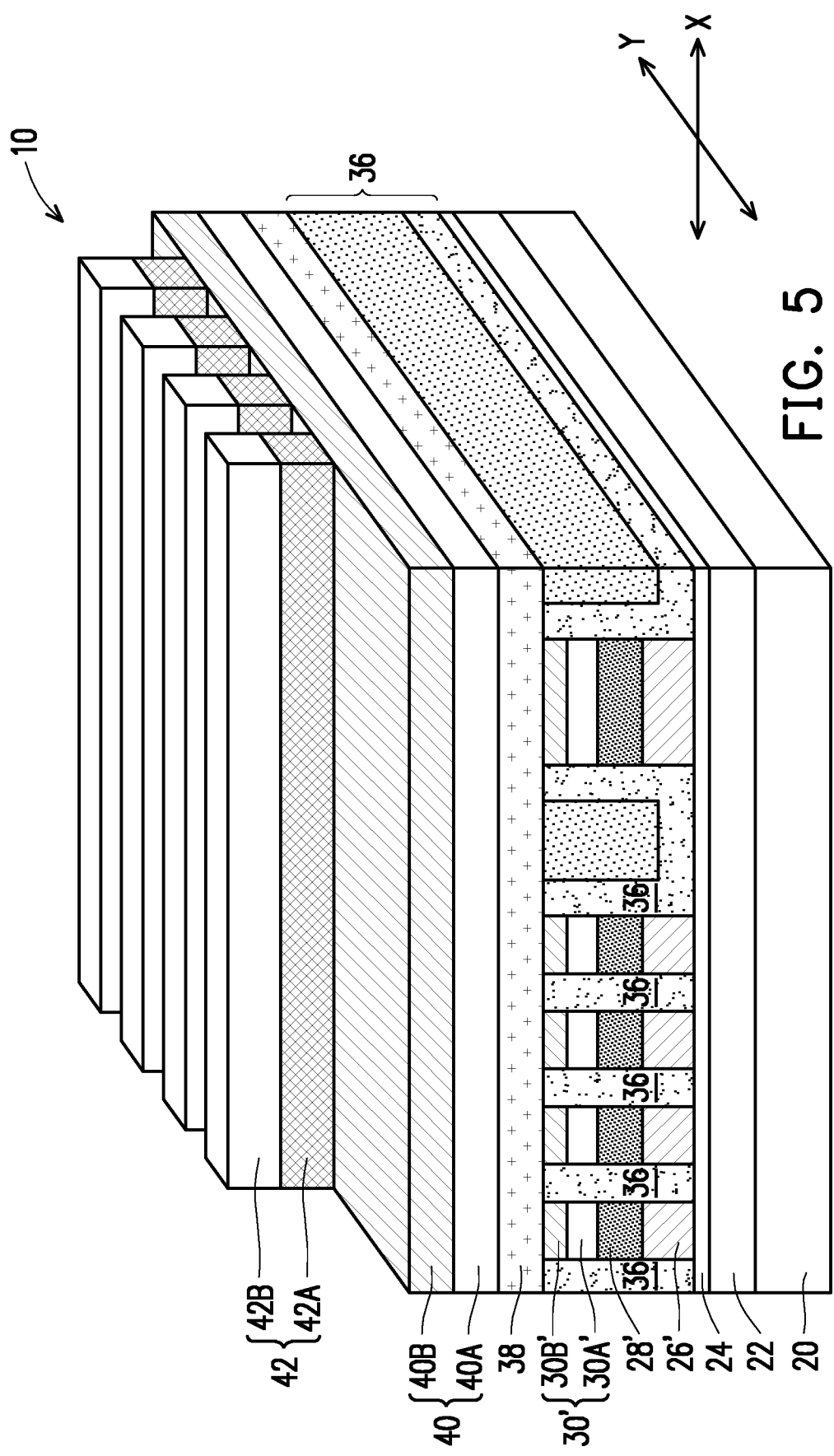

Referring to FIG. 5, etching masks 42 are formed over top electrode layer 40. The respective process is illustrated as process 218 in the process flow 200 shown in FIG. 18. In accordance with some embodiments of the present disclosure, etching masks 42 include hard masks 42A and photo resist 42B over hard masks 42A. The formation processes may include blanket depositing a hard mask layer, applying and patterning photo resist 42B through light-exposure and development, and then etching the hard mask layer to form hard masks 42A.

Figure 6:
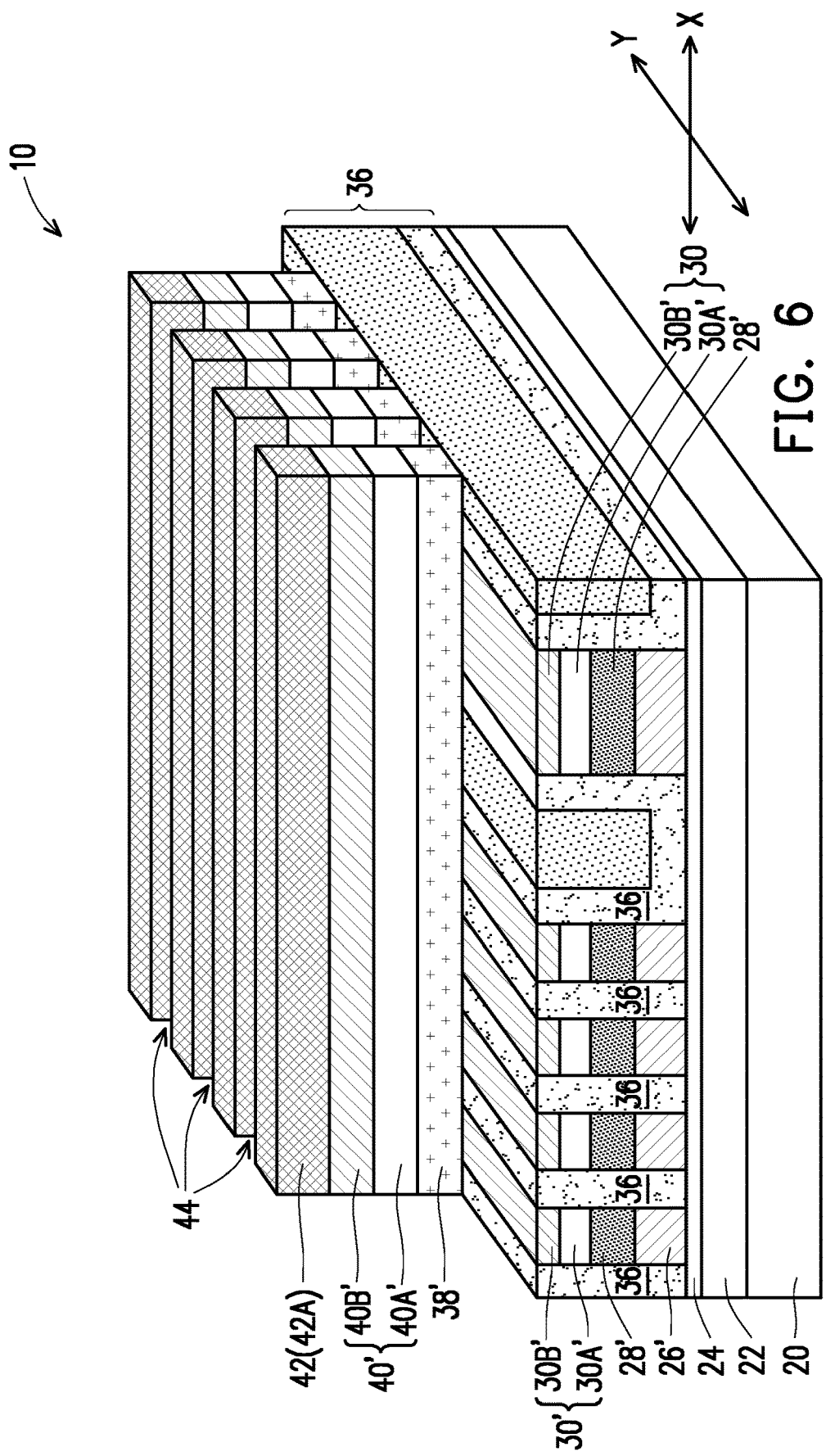

Referring to FIG. 6, top electrode layer 40 and RAM layer 38 are etched using etching masks 42 as the etching mask. The respective process is illustrated as process 220 in the process flow 200 shown in FIG. 18. After the etching, gap-filling regions 36 and electrode strips 30' are exposed. The remaining portions of top electrode layer 40 form top electrode strips 40', which includes electrode strips 40A' and 40B'. The remaining portions of RAM layer 38 form RAM strips 38', which are also referred to as memory strips 38'. Both of top electrode strips 40' and RAM strips 38' are elongated strips extending in the X-direction, and are separated from each other by gaps 44.

Figure 7A:
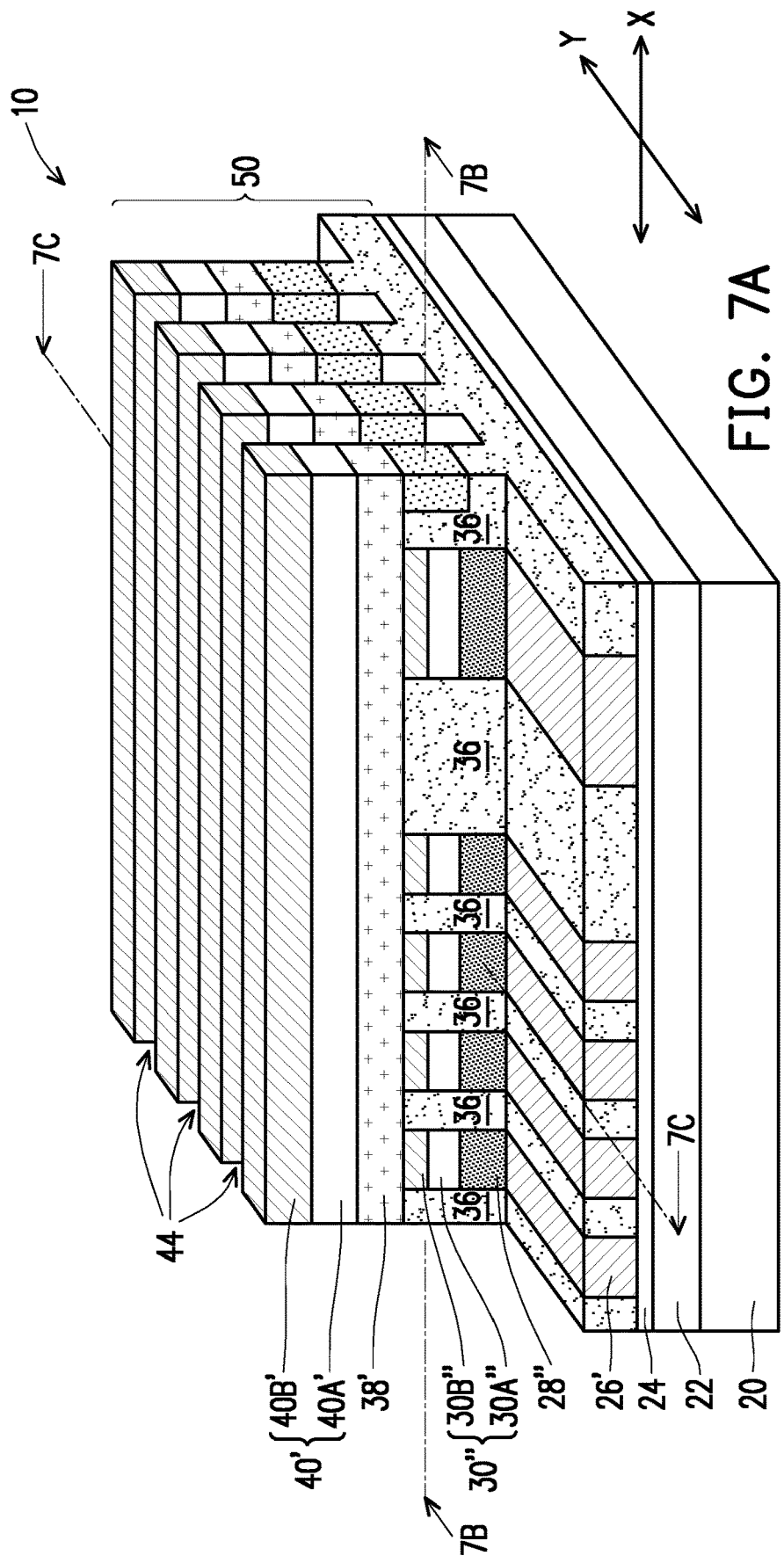
Figure 7B:
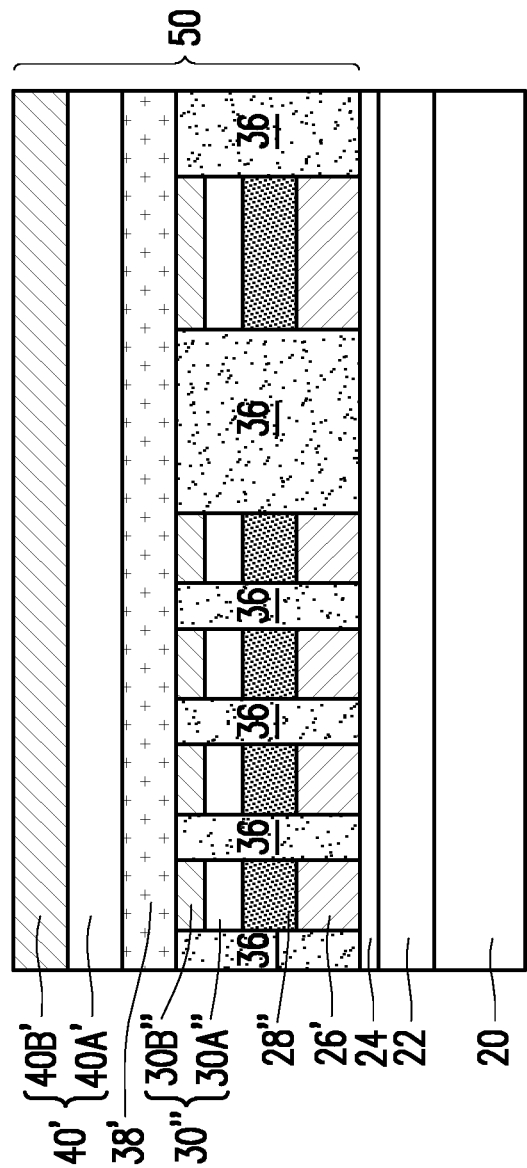
Figure 7C:
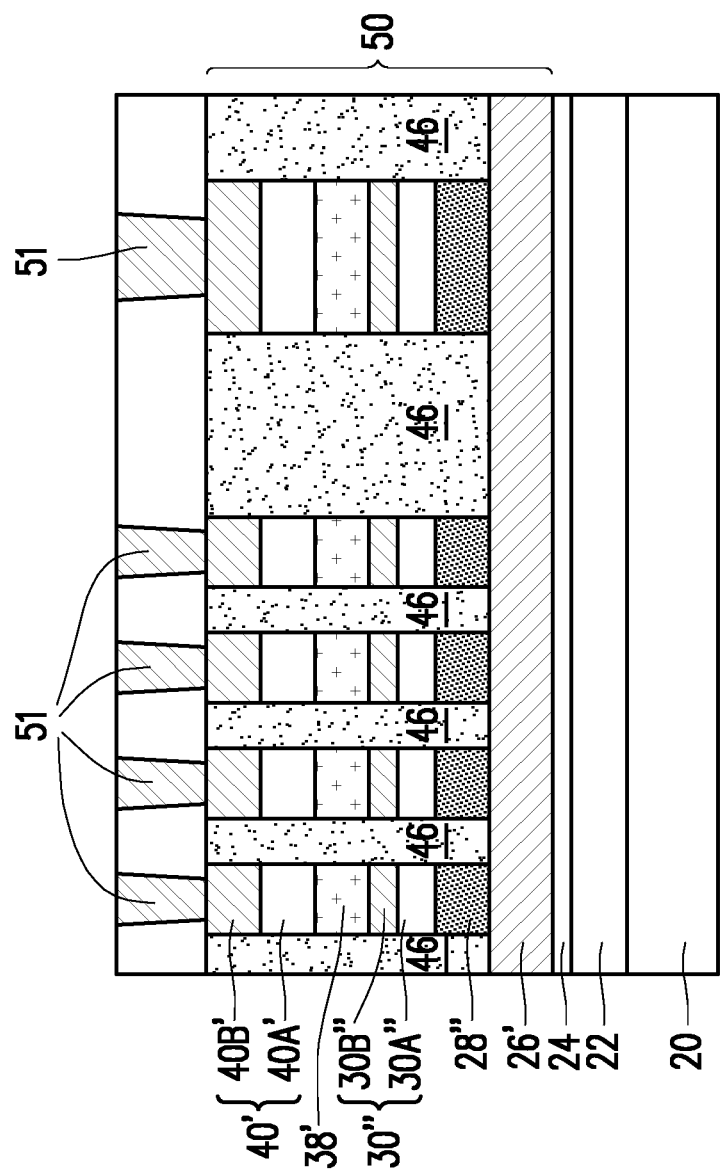

Next, the etching continues to etch-through gap-filling regions 36, electrode strips 30', and selector strips 28'. The respective process is illustrated as process 222 in the process flow 200 shown in FIG. 18. After the etching process, the remaining portions (such as 42A) of etching mask 42 are removed. The etching is stopped on the top surfaces of bottom electrode strips 26'. The resulting structure is illustrated in FIGS. 7A, 7B, and 7C. Electrode strips 30' (FIG. 6) are etched again to form electrodes 30" (including electrodes 30A" and 30B"), which form an array having columns in the X-direction and rows in the Y-direction. Selector strips 28' (FIG. 6) are also etched again to form selectors 28", which also form an array. The selectors 28" of the same row are located on, and contacting, the same bottom electrode strip 26'. The bottom electrode strips 26', selectors 28", electrodes 30", RAM strips 38', and top electrode strips 40' are in combination referred to as RAM 50, which is also shown in the perspective view in FIG. 16.

FIG. 7B illustrates the reference cross-section 7B-7B in FIG. 7A. As shown in FIG. 7B, top electrode strips 40' and RAM strips 38' are elongated strips, which extend throughout the respective column of RAM 50. This differs from conventional memory arrays, in which the state-storage layers are patterned as an array rather than being strips. Alternatively stated, the RAMs in a same row in accordance with some embodiments of the present disclosure are portions of a continuous RAM strip, rather than being separated into discrete RAM elements. Keeping RAM strips 38' as strips has some advantageous features. If RAMs are to be formed as discrete array elements, RAM layer 38 (FIG. 5) needs to be deposited before the patterning process as shown in FIG. 2, so that RAM layer 38 may be patterned in the process shown in FIG. 2. This, however, means that the gaps 34 as shown in FIG. 2 have higher aspect ratios (the ratios of depths to the corresponding widths). The gaps 34 with higher aspect ratios are more difficult to fill when gap-filling regions 36 are formed, and voids may be adversely generated. The voids are subject to the filling of the RAM layer 38, which may cause defects. In addition, the gaps with higher aspect ratios need to have thicker hard masks 32 (FIG. 1), again making the corresponding lithography processes more difficult.

FIG. 7C illustrates the reference cross-section 7C-7C in FIG. 7A. As shown in FIG. 7C, bottom electrode strips 26' are elongated, which extends throughout the respective row. In subsequent processes, the gaps 44 as shown in FIG. 7A are filled by gap-filling dielectric regions 46, which are shown in FIG. 7C. The respective process is illustrated as process 224 in the process flow 200 shown in FIG. 18. The formation process and the materials of gap-filling dielectric regions 46 may be similar to that of gap-filling regions 36, and are not repeated herein. In the resulting structure, RAM array 50 is formed, which includes bottom electrode strips 26' and top electrode strips 40', which may be used as word lines and bit lines, respectively. Alternatively, bottom electrode strips 26' may be used as bit lines, while top electrode strips 40' may be used as word lines. Selectors 28" correspond to the overlying state-storage elements, which are parts of the elongated RAM strips 38' (FIGS. 7A and 7B).

In a subsequent process, as shown in FIG. 7C, vias 51 are formed over top electrode strips 40', with each of the vias 51 contacting one of the top electrode strips 40'. The voltages and currents for programming and reading the RAM 50 thus may be provided to top electrode strips 40'.

Figure 16:
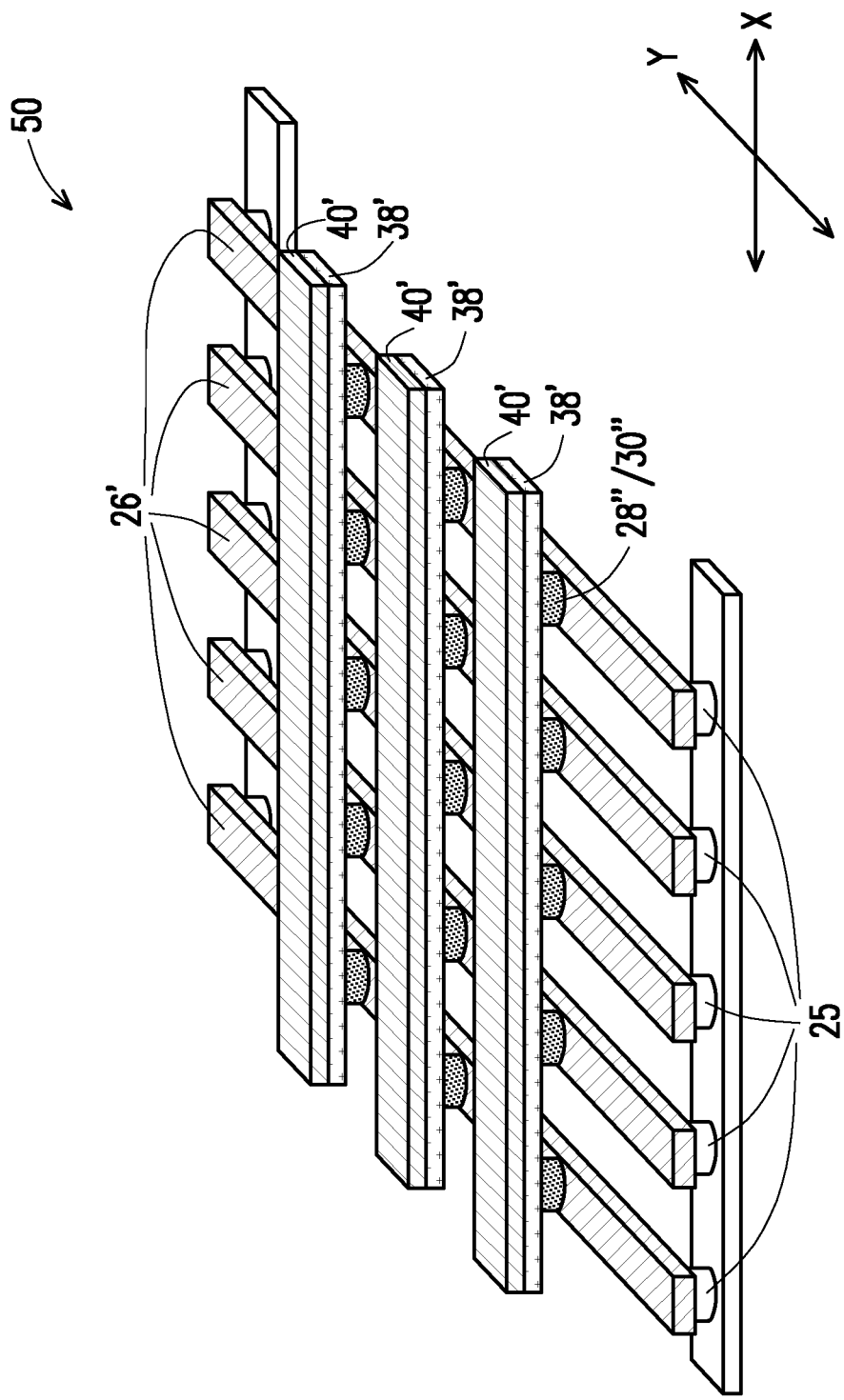
FIG. 16 illustrates the perspective view of RAM cells in accordance with some embodiments.

FIG. 16 illustrates a perspective view of the structures shown in FIGS. 7A, 7B, and 7C, with the gap-filling regions not shown. Vias 25 are illustrated as being under each of the bottom electrode strips 26', which may be used as word lines. Over each of the word lines 26', a plurality of discrete selectors 28" are formed. Electrodes 30" may be further formed over selectors 28". A plurality of electrodes 30" in the same row (in the X-direction) are underlying, and may be in contact with, a same RAM strip 38'. Furthermore, top electrode strips 40' overlap the respective underlying RAM strips 38', and all edges of top electrode strips 40' may be flush with the respective edges of the respective underlying RAM strips 38'. Top electrode strips 40' may be used as bit lines.

Figure 17:
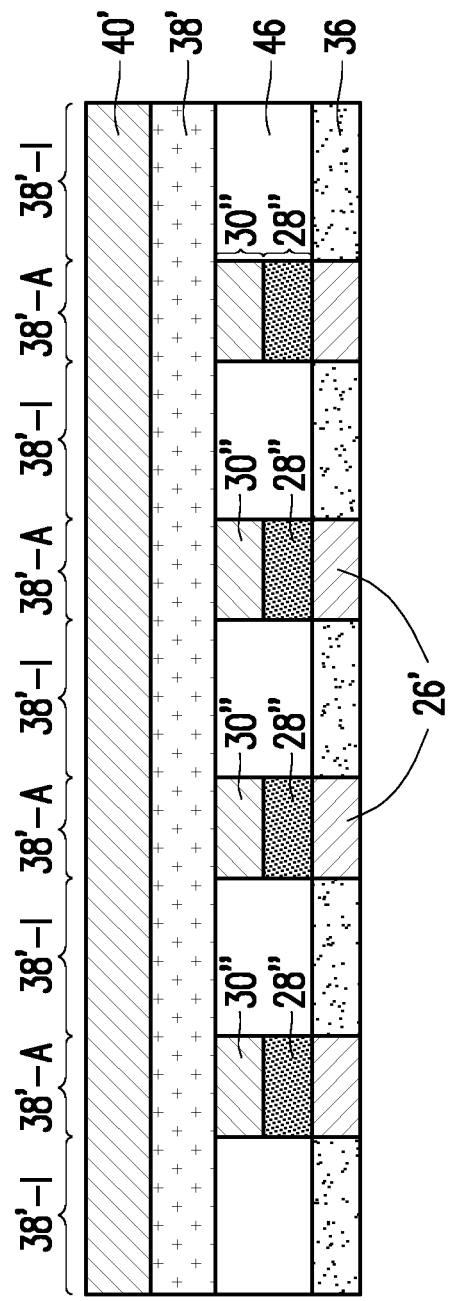
FIG. 17 illustrates the cross-sectional view of RAM cells in accordance with some embodiments.

FIG. 17 illustrates a cross-sectional view of the structure shown in FIG. 16. As shown in FIG. 17, each of RAM strips 38' includes a plurality of active portions 38'-A and inactive portions 38'-I positioned alternatingly. Active portions 38'-A are the portions overlapping electrodes 30", selectors 28", and electrode strips 26'. Inactive portions 38'-I are between active portions 38'-A. Inactive portions 38'-I do not overlap any of electrodes 30", selectors 28", and electrode strips 26'. The state-storage material in inactive portions 38'-I are free from conductive filaments therein and hence are always in high-resistance state. Active portions 38'-A are used for storing states, and their states may flip, for example, by applying appropriate programming voltages on bottom electrode strip 26' and top electrode strip 40', or conducting a proper programming current between bottom electrode strip 26' and top electrode strip 40'. Inactive portions 38'-I, on the other hand, have a fixed state regardless of the states of the neighboring active portions 38'-A. The states of inactive portions 38'-I will not affect the value read from the neighboring active portions 38'-A. For example, inactive portions 38'-I may always have high resistance values, and do not include electrical conductive filaments paths therein. Accordingly, if a neighboring RAM is at a low-resistance state, a low-resistance value will be appropriately read, and when the neighboring RAM is at a high-resistance state, a high-resistance state value will be appropriately read. In accordance with some embodiments when RAMs 50 are CBRAMs, no conductive filaments are in inactive portions 38'-I, and the state of a neighboring active portion 38'-A is determined by whether the active portion 38'-A has a conductive filament or not, and not affected by the neighboring inactive portions 38'-I. In another example when RAMs 50 are PCRAMs, the chalcogenide semiconductor material in inactive portions 38'-I are amorphous, and hence have high resistance values. The state of a neighboring active portion 38'-A may be amorphous or crystalline, which determines whether it has a high resistance or a low resistance.

It is appreciated that although RAM strips 38' are elongated strips, and do not form arrays, active portions 38'-A are arrays. Inactive portions 38'-I are not the functional parts of the memory portion for memorizing the states, and electrically isolate active portions 38'-A from each other. The functions of inactive portions 38'-I are thus similar to dielectric regions. Accordingly, throughout the description, the circuit as shown in FIGS. 16 and 17 are still referred to as a RAM array since the active portions 38'-A form an array by the electrically insulating inactive portions 38'-I, although the active portions 38'-A and inactive portions 38'-I, at the time of deposition and patterning, are formed of the same material.

FIGS. 8 through 15 illustrate cross-sectional views of intermediate stages in the formation of stacked RAM arrays in accordance with some embodiments of the present disclosure. The stacked RAM arrays may be operated separately, while the formation of the stacked RAM arrays may share common electrodes and same patterning processes, so that the manufacturing cost is saved. Unless specified otherwise, the materials and the formation processes of the components in these embodiments are essentially the same as the like components, which are denoted by like reference numerals in the preceding embodiments shown in FIGS. 1-6, 7A, 7B, and 7C. The details regarding the formation process and the materials of the components shown in FIGS. 8 through 15 may thus be found in the discussion of the preceding embodiments.

Figure 8:
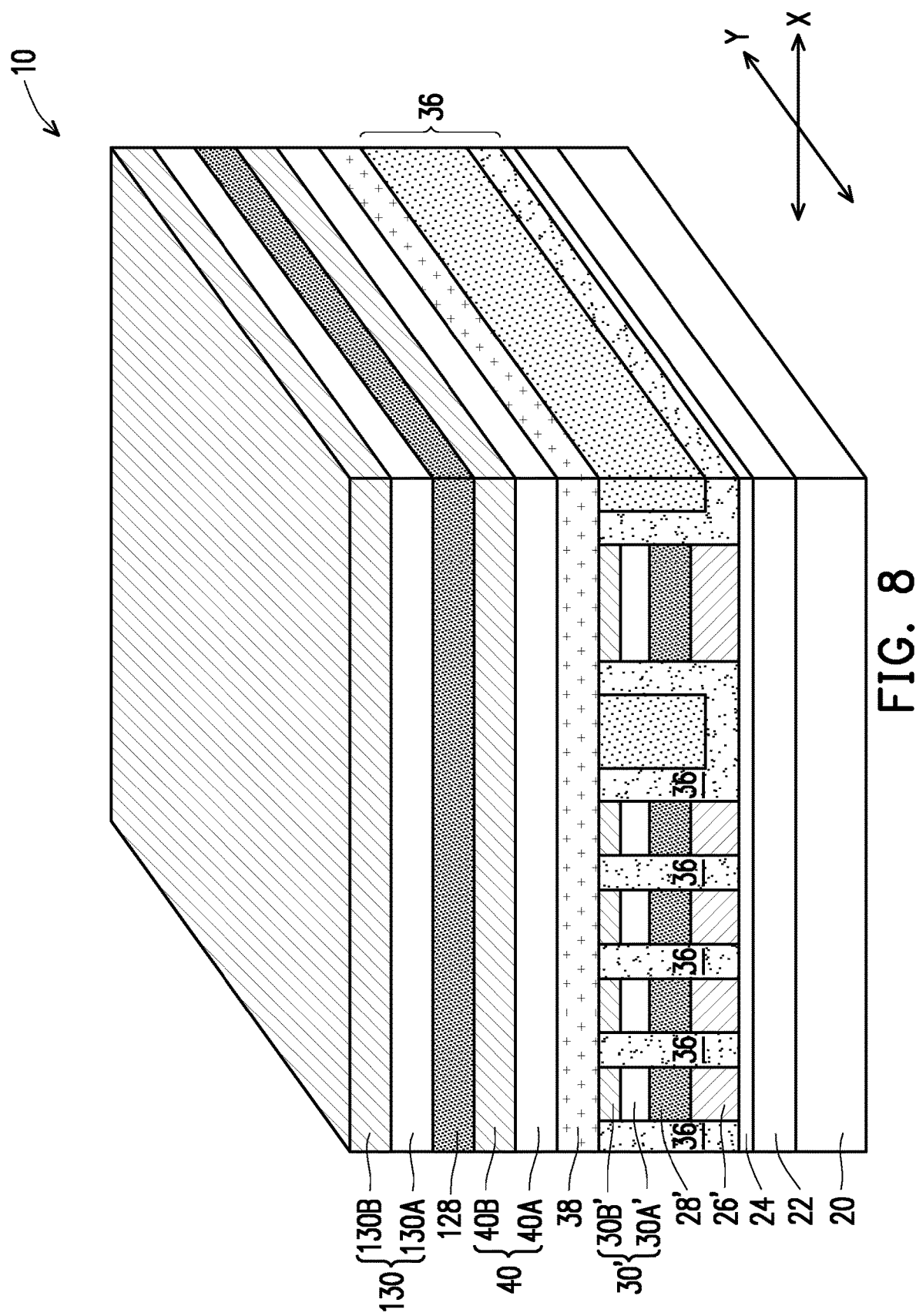
FIGS. 8-15 illustrate the perspective views of intermediate stages in the formation of stacked RAM cells in accordance with some embodiments.

The initial steps of these embodiments are essentially the same as shown in FIGS. 1 through 4. RAM layer 38 and electrode layer 40 are deposited as blanket layers, and are not patterned. In accordance with some embodiments, electrode layer 40 is referred to as a middle electrode layer rather than a top electrode layer since it is the electrode layer in the middle of two stacked RAM arrays. The subsequent process is shown in FIG. 8, in which selector layer 128 and electrode layer 130 are deposited. Selector layer 128 may be formed of the materials and structures selected from the same candidate groups of materials and structures for forming selector layer 28. Furthermore, the materials and structures of selector layer 128 may be the same or different from that of selector layer 28. Electrode layer 130 may have a single layer structure formed of a single layer, or may have a multi-layer structure formed of multiple layers. For example, electrode layer 130 may include layers 130A and 130B, which may be formed of similar or the same materials as that of electrodes 30A" and 30B", respectively.

Figure 9:
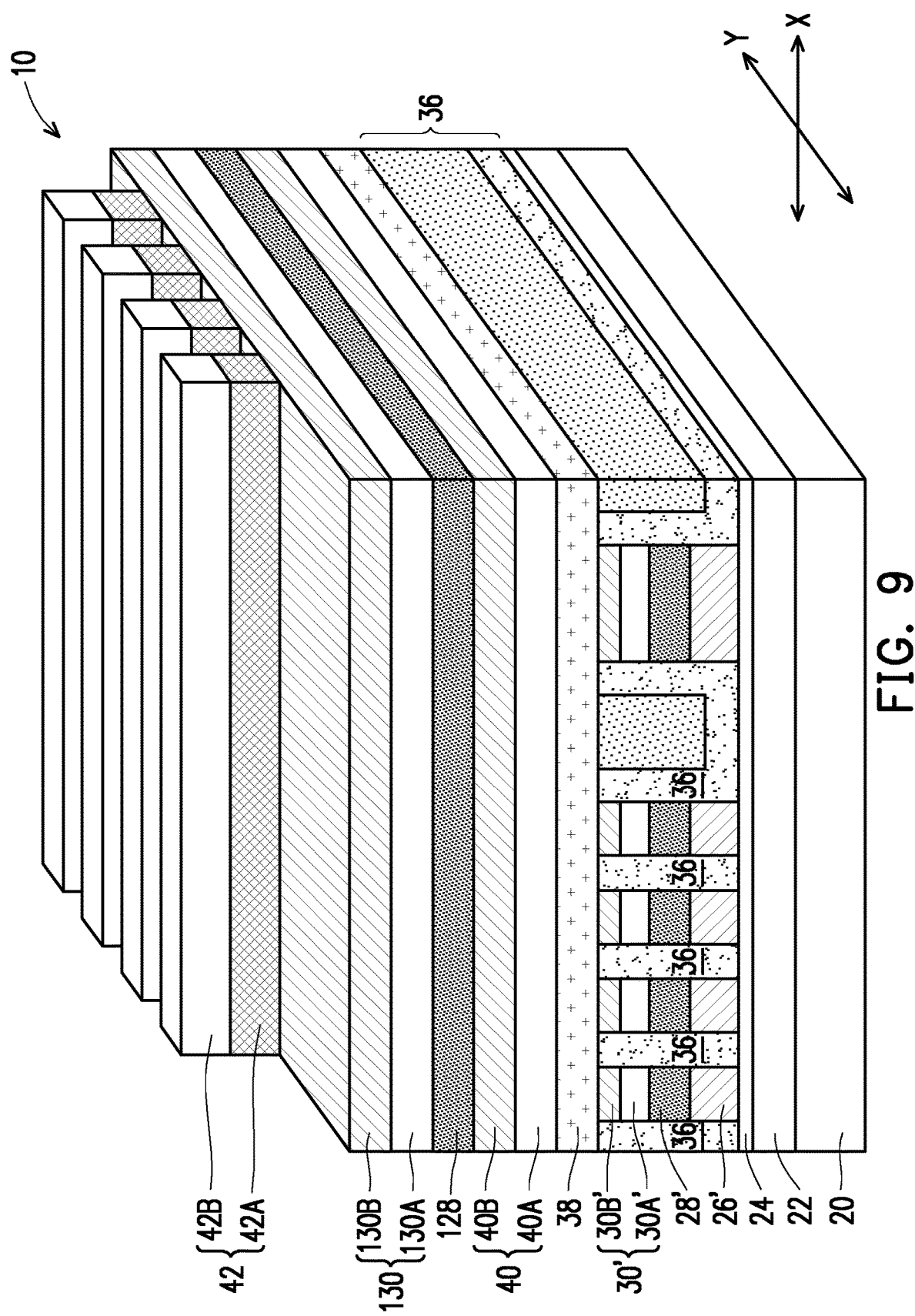
Figure 10:
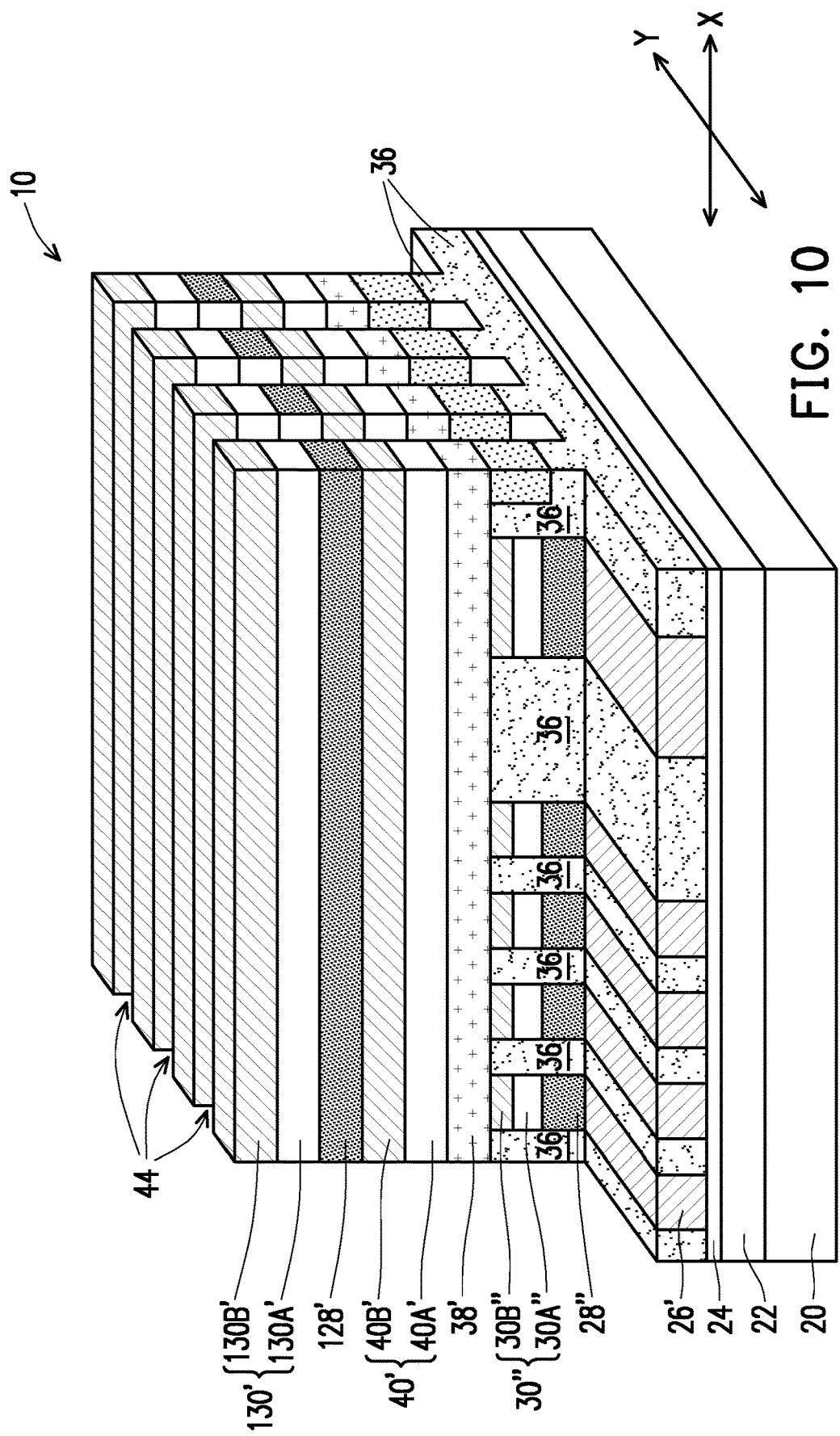

FIG. 9 illustrates the formation of patterned etching masks 42, which are essentially the same as the etching masks 42 shown in FIG. 5. Next, a patterning process is performed using etching masks 42 to etch underlying layers including electrode layer 130, selector layer 128, middle electrode layer 40, RAM layer 38, electrode strips 30', selector strips 28', and gap-filling regions 36. After the etching process, the remaining portions of hard masks 42 are removed. The resulting structure is shown in FIG. 10. The etching is anisotropic, and is stopped when the top surfaces of bottom electrode strips 26' are exposed. Bottom electrode strips 26' remain as being elongated strips extending in the Y-direction after the etching process. On the other hand, selectors 28" and electrodes 30" are formed as discrete features that are laid out as arrays, as shown in FIG. 16. Each row of selectors 28" are located on, and contacting, the same bottom electrode strip 26'. As a result of the etching, the remaining portions of electrode layer 130 form electrode strips 130', which include strips 130A' and 130B'. The remaining portions of selector layer 128 form selector strips 128'. The remaining portions of middle electrode layer 40 form middle electrode strips 40', which include strips 40A' and 40B'. The remaining portions of RAM layer 38 form RAM strips 38'. Electrode strips 130', selector strips 128', middle electrode strips 40', and RAM strips 38' are elongated strips having lengthwise directions in the X-direction, and are separated from each other by gaps 44. The bottom electrode strip 26', selectors 28", electrodes 30", RAM strips 38', and top electrode strips 40' are also shown in the perspective view in FIG. 16.

In FIG. 10, two layers of selector features including selector strips 28' and selector layer 128 are etched using common etching mask 42 to form selectors 28" and selector strips 128', respectively. Alternatively stated, the processes and the etching masks 42 for etching the selectors and upper electrodes of the lower RAM stack are shared by the etching of the selectors and lower electrodes of the upper RAM array. The manufacturing cost is thus saved. Similarly, RAM layer 138 (FIG. 12) is formed after etching process as shown in FIG. 11, so that the etching process shown in FIG. 10 may be performed with less difficulty, and masks 42 (FIG. 9) may be formed thinner.

Figure 11:
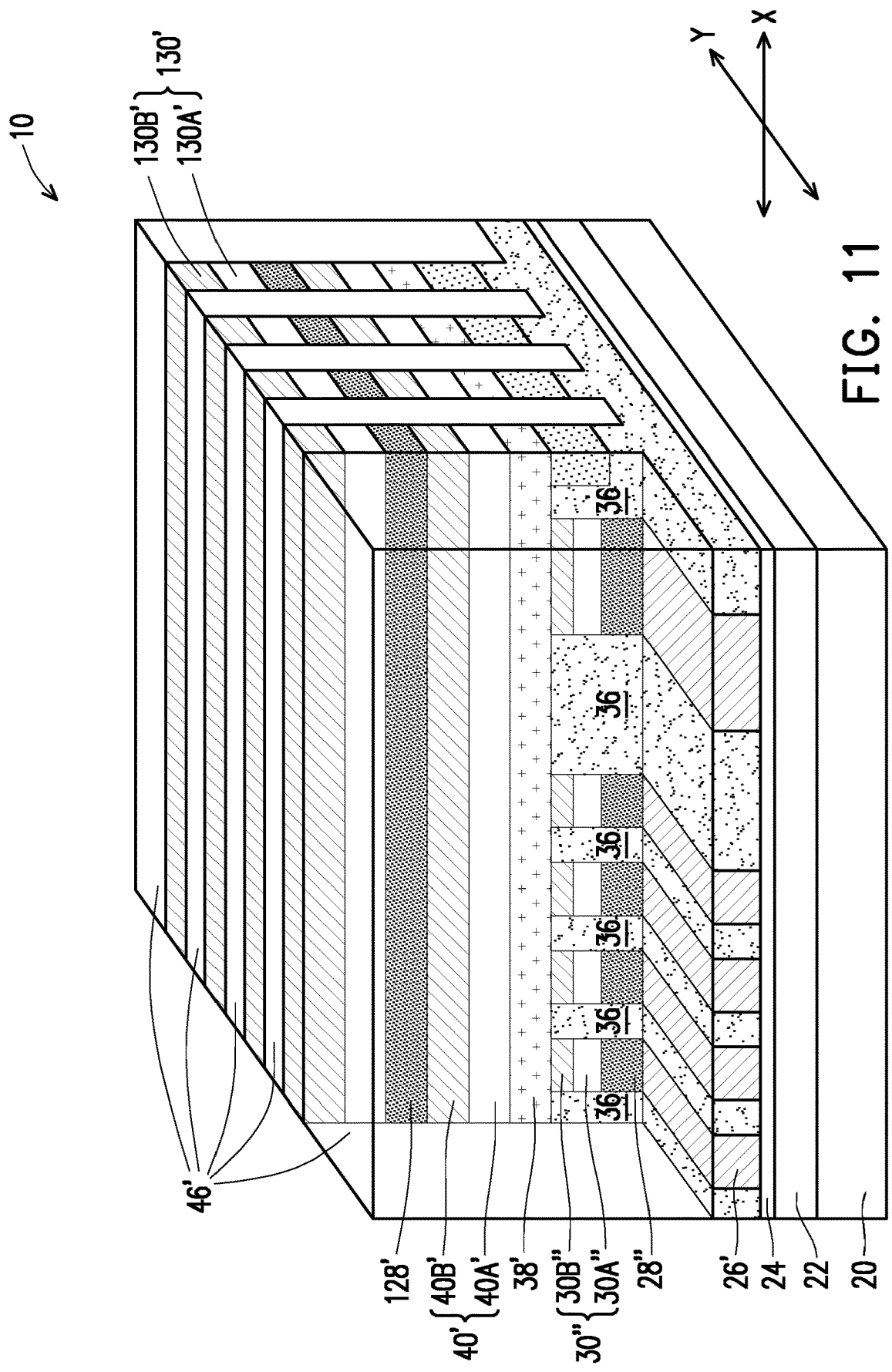

The gaps 44 as shown in FIG. 10 are then filled with a dielectric material(s) to form gap-filling regions 46', which are shown in FIG. 11. The formation process may include depositing a dielectric layer(s), and then performing a planarization process to remove excess dielectric materials. In the planarization process, electrode strips 130' may be used as a polish stop layer.

Figure 12:
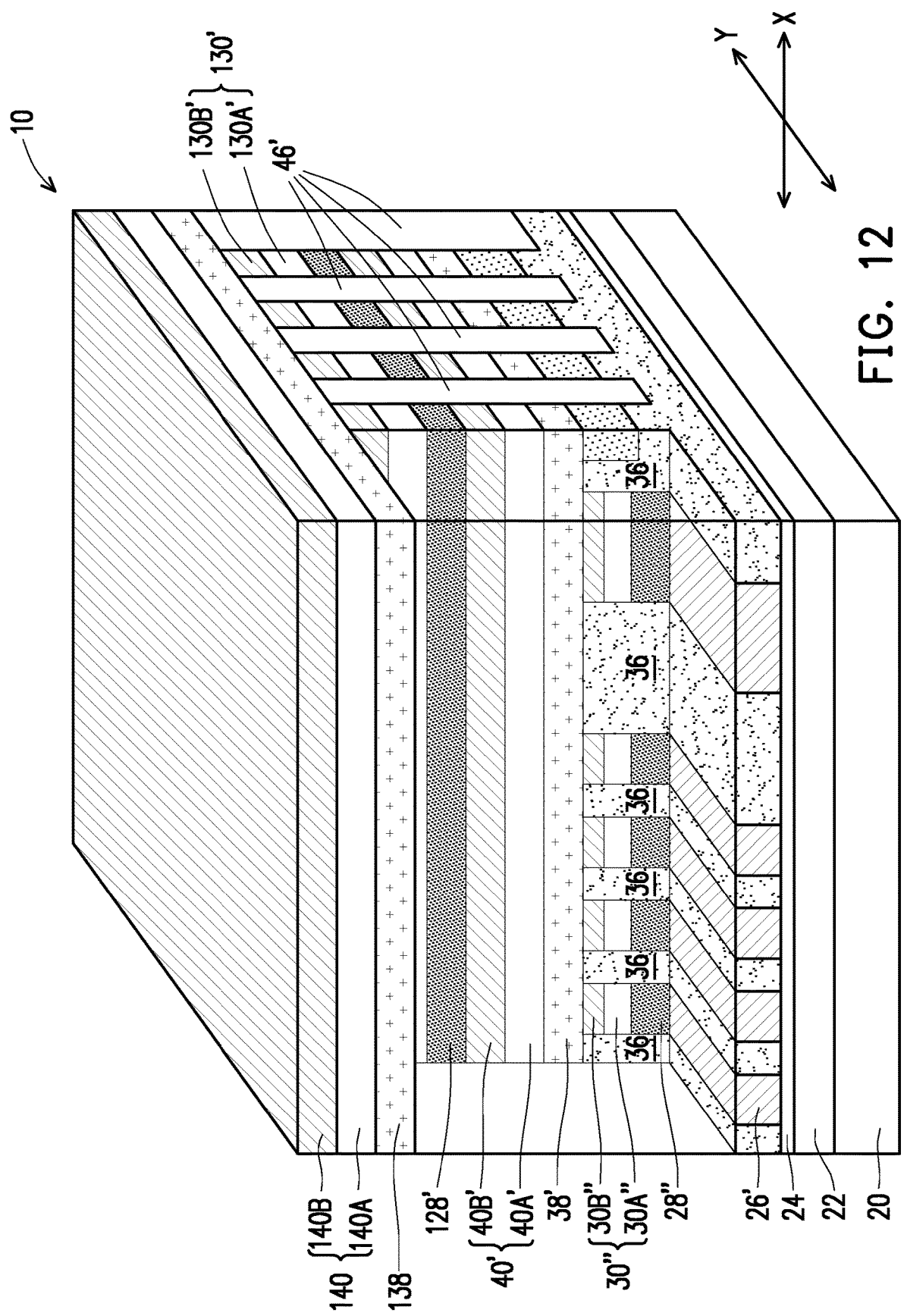

FIG. 12 illustrates the formation of RAM layer 138. In accordance with some embodiments, RAM layer 138 is for forming memories including, and not limited to, MRAMs, CBRAMs, PCRAMs, FeRAMs, or the like. Accordingly, RAM layer 138 may include one or a plurality of layers that have the ability to store and change states. Depending on the type of the RAM, the one or plurality of layers in RAM layer 138 may have the appropriate structure and materials. The type of RAM layer 138 may be the same or different from that of RAM layer 38 (FIG. 4). For example, when RAM layer 38 is for forming CBRAMs, RAM layer 138 may be for forming CBRAMs, or may be for forming MRAMs, PCRAMs, or FeRAMs.

Next, top electrode layer 140 is formed. Top electrode layer 140 is a conductive layer, which may be or comprise a metal layer. In accordance with some embodiments, top electrode layer 140 comprises adhesion layer 140A and metal layer 140B. In accordance with some embodiments, adhesion layer 140A comprises titanium, tantalum, titanium nitride, tantalum nitride, tungsten, or the like, or alloys thereof. Metal layer 140B may also be formed of or comprise tungsten, copper, nickel, platinum, iridium, gold, titanium-nitride (TiN), or the like.

Figure 13:
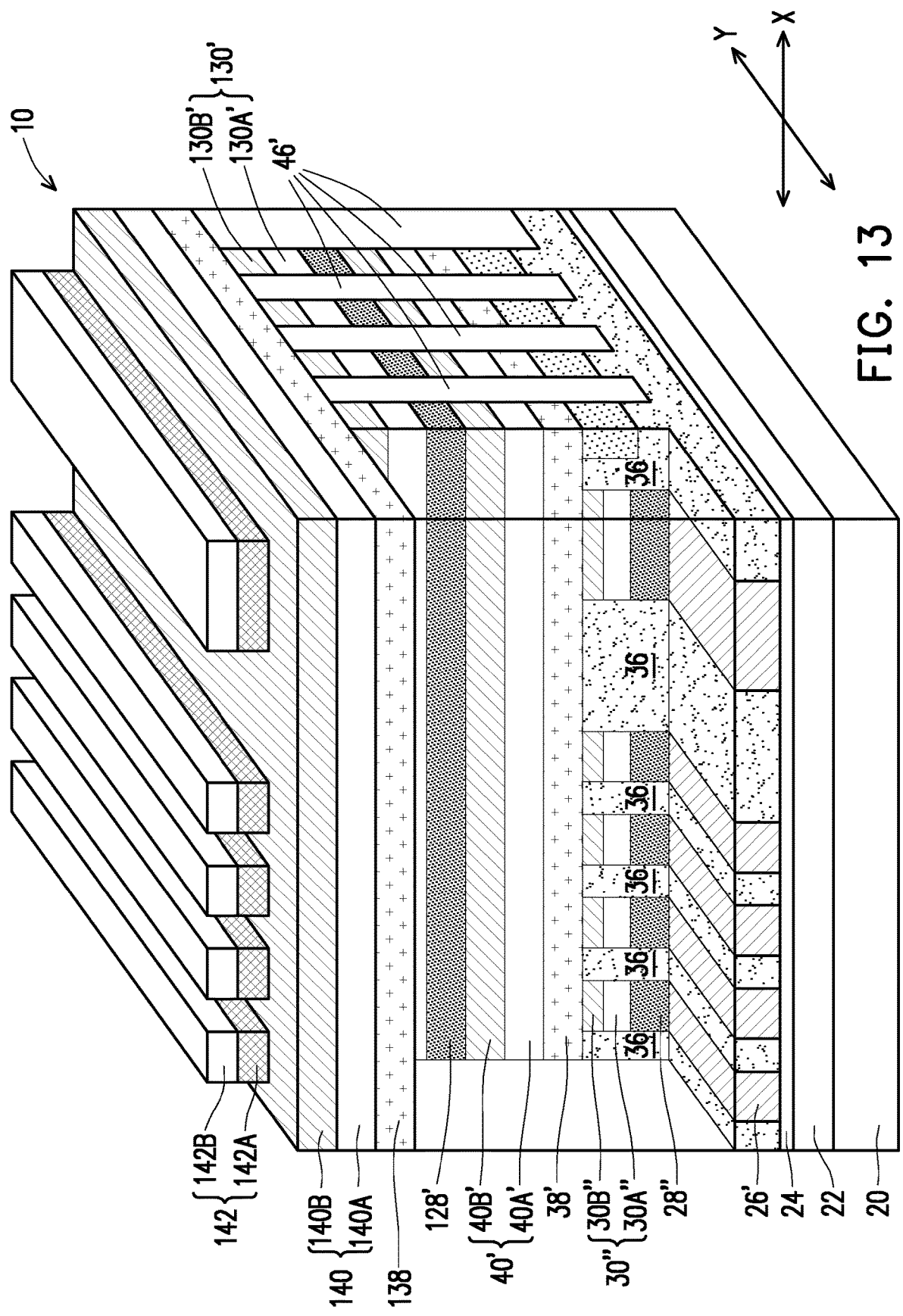

Referring to FIG. 13, etching masks 142 are formed over top electrode layer 140. In accordance with some embodiments of the present disclosure, etching masks 142 include hard masks 142A and photo resist 142B over hard masks 142A. The formation processes may include blanket depositing a hard mask layer, applying and patterning photo resist 142B, and then etching the hard mask layer to form hard masks 142A.

Figure 14:
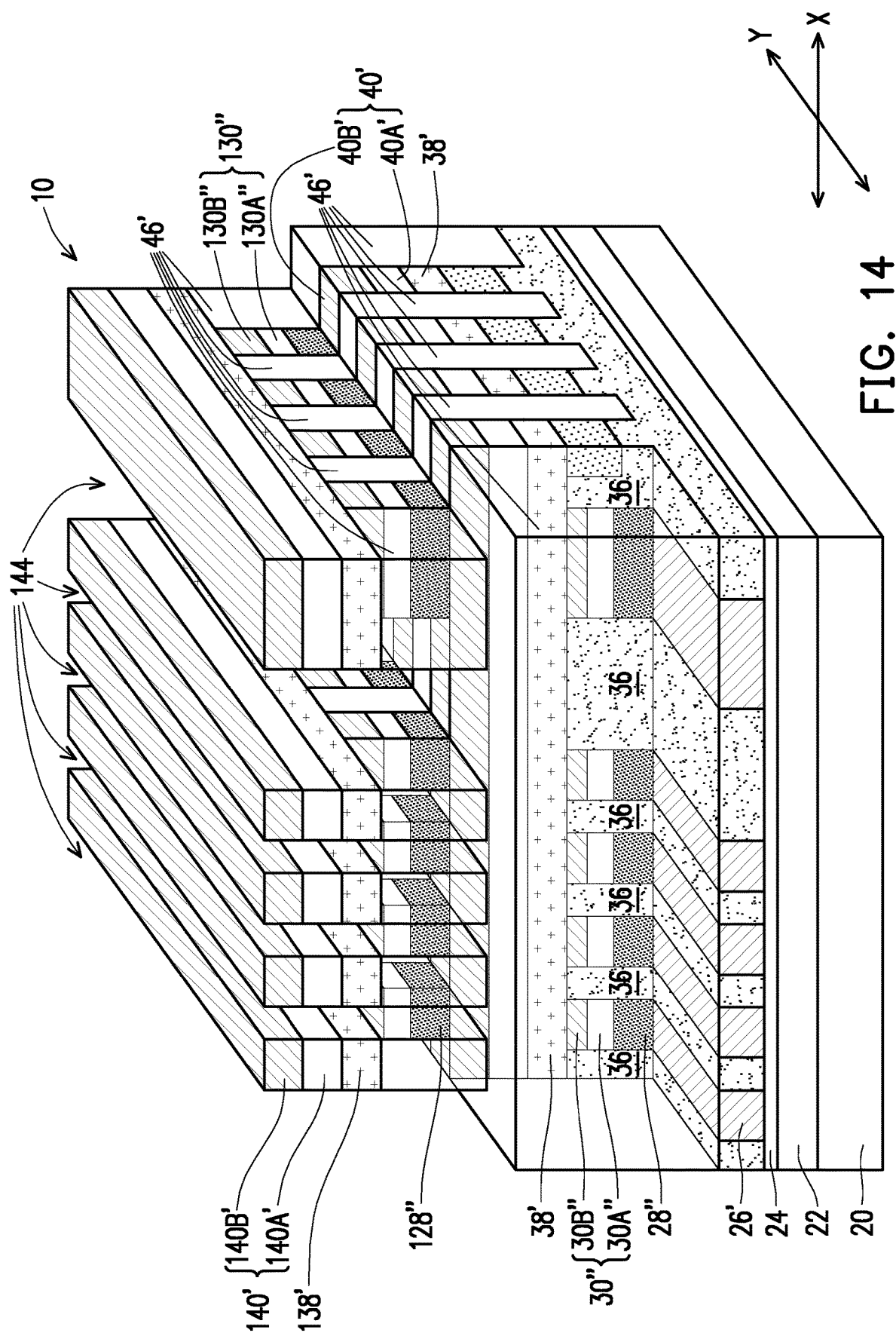

Referring to FIG. 14, top electrode layer 140 and RAM layer 138 are etched using etching masks 142 to define the patterns. The top portions of gap-filling regions 46' are also etched. Gaps 144 are thus formed. After the etching, the bottom portions of gap-filling regions 46' and electrode strips 40' are exposed. The etching stops on electrode strips 40', and hence electrode strips 40' remain as elongated strips extending in the X-direction. The remaining portions of top electrode layer 140 are electrode strips 140' (including electrode strips 140A' and 140B'). The remaining portions of RAM layer 138 are RAM strips 138'. Electrode strips 130' (FIG. 13) are etched again to form electrodes 130" (including electrodes 130A" and 130B"), which form an array having rows in the Y-direction and columns in the X-direction. Selector strips 128' (FIG. 13) are also etched again to form selectors 128", which form an array.

Figure 15:
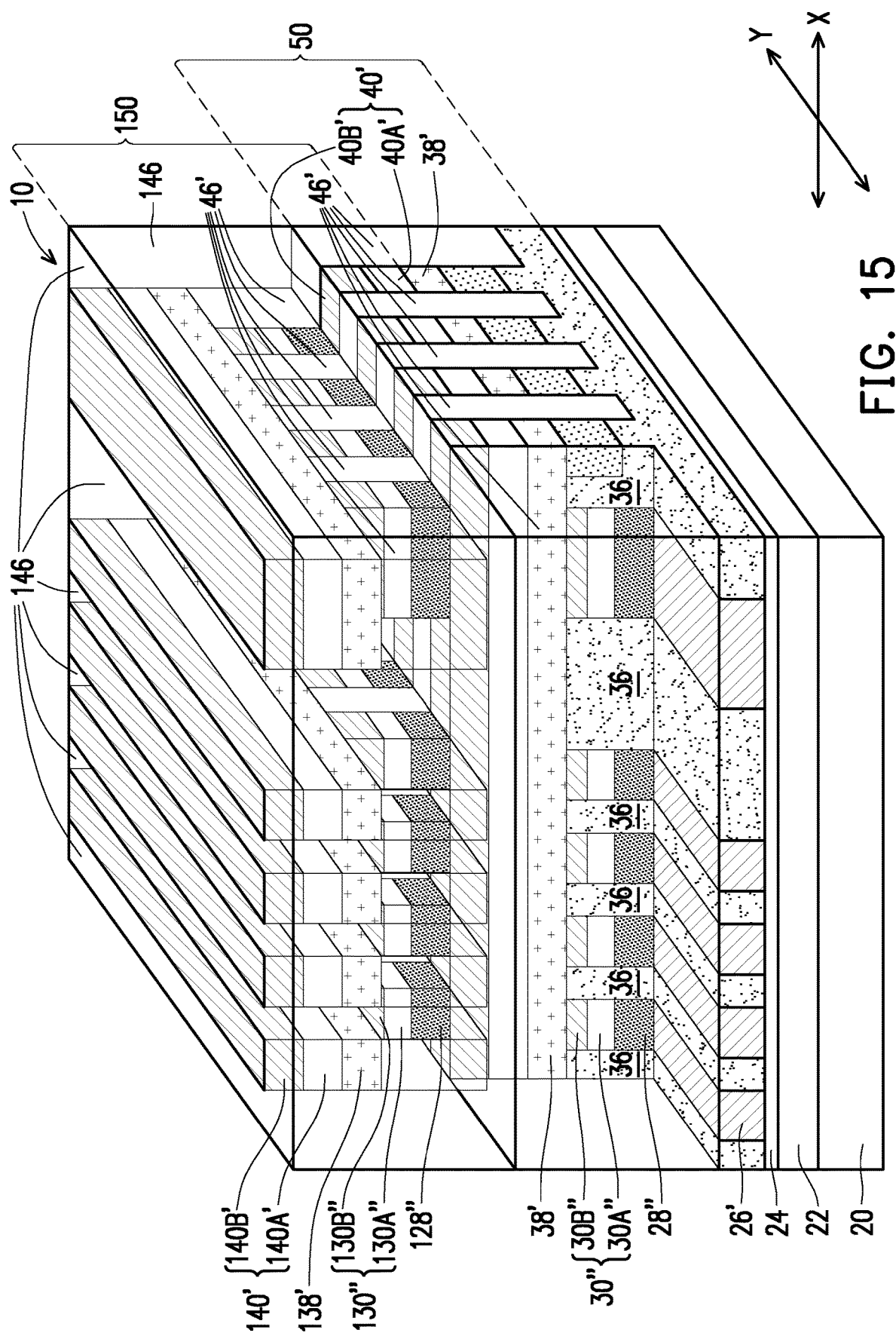

In subsequent processes, the gaps 144 are filled by gap-filling dielectric regions 146, which are shown in FIG. 15. The formation process and the materials of gap-filling dielectric regions 46 may be similar to that of gap-filling regions 36, and are not repeated herein.

In the resulting structure, there are two RAMs. The bottom RAM 50 include bottom electrode strips 26', selectors 28", electrodes 30", RAM strips 38', and electrode strips 40'. The top RAM 150 include electrode strips 40', selectors 128", electrodes 130", RAM strips 138', and electrode strips 140'. Accordingly, electrode strips 40' are shared by both of the bottom RAM 50 and top RAM 150. When bottom RAM 50 is operated (programmed or read), electrode strips 26' may be used as word lines (or bit lines), and electrode strips 40' may be used as bit lines (or word lines). When top RAM 150 is operated, electrode strips 40' may be used as word lines (or bit lines), and electrode strips 140' may be used as bit lines (or word lines).

The embodiments of the present disclosure have some advantageous features. By adopting RAM strips rather than discrete RAM array elements in the RAMs, the gaps to be filled with dielectric materials may have smaller aspect ratios, and the gap-fill processes are easier, and suffer less from process difficulties in the gap-filling processes. The hard masks for etching may also be thinner, again resulting in reduced process difficulty. Furthermore, with the RAM layer(s) patterned in one direction rather than two directions, the RAMs may be formed smaller and suffer less from the problems associated with small dimensions such as optical proximity problems.

In accordance with some embodiments of the present disclosure, a method comprises depositing a first electrode layer; depositing a first selector layer over the first electrode layer; forming a second electrode layer over the first selector layer; performing a first patterning process, wherein the first electrode layer, the first selector layer, and the second electrode layer are patterned as first electrode strips, first selector strips, and second electrode strips, respectively;

depositing a memory layer over the second electrode strips; depositing a third electrode layer over the memory layer; and performing a second patterning process, wherein the third electrode layer and the memory layer are patterned as third electrode strips and memory strips, respectively, and wherein the second electrode strips and the first selector strips are patterned as a first electrode array and a first selector array, respectively. In an embodiment, the method further comprises, after the first patterning process, filling a dielectric region into gaps between the first electrode strips, the first selector strips, and the second electrode strips; and performing a planarization process, wherein the second electrode strips are used as a polish stop layer in the planarization process. In an embodiment, the second patterning process is stopped on top surfaces of the first electrode strips. In an embodiment, the method further comprises forming a plurality of conductive vias, each overlying and contacting one of the third electrode strips, wherein at a time after the plurality of conductive vias are formed, each of the memory strips is a continuous strip with portions overlapping a plurality of selectors in the first selector array. In an embodiment, the depositing the memory layer comprises depositing a phase change material. In an embodiment, wherein the depositing the memory layer comprises depositing an oxide. In an embodiment, the method further comprises, before depositing the third electrode layer, depositing a second selector layer, wherein in the second patterning process, the second selector layer is patterned as second selector strips. In an embodiment, the method further comprises, before depositing the third electrode layer, depositing an additional memory layer over the second selector layer: depositing a fourth electrode layer over the additional memory layer; and performing a third patterning process, wherein the fourth electrode layer and the additional memory layer are patterned as fourth electrode strips and additional memory strips, respectively.

In accordance with some embodiments of the present disclosure, a device comprises a first plurality of conductive strips have lengthwise directions in a first direction; a first selector array overlapping the first plurality of conductive strips; a first electrode array overlapping the first selector array; a first plurality of memory strips over the first electrode array; and a second plurality of conductive strips overlapping the first plurality of memory strips, wherein the first plurality of memory strips and the second plurality of conductive strips have lengthwise directions in a second direction perpendicular to the first direction. In an embodiment, the device further comprises a plurality of conductive vias, each overlying and contacting one of the second plurality of conductive strips. In an embodiment, each of the first plurality of memory strips overlaps a plurality of selectors in the first selector array. In an embodiment, the device further comprises a plurality dielectric strips separating: electrodes in the first electrode array from each other; and selectors in the first selector array from each other. In an embodiment, top surfaces of the plurality dielectric strips are in contact with bottom surfaces of the first plurality of memory strips. In an embodiment, the first plurality of memory strips comprise state-storage elements of memories selected from the group consisting of RRAMs, CBRAMs, MRAMs, and PCRAMs. In an embodiment, the device further comprises a second selector array overlapping and contacting the second plurality of conductive strips; a second electrode array overlapping the second selector array; a second plurality of memory strips over the second electrode array; and a third plurality of conductive strips overlapping the second plurality of memory strips, wherein the second plurality of memory strips and the third plurality of conductive strips have lengthwise directions in the first direction.

In accordance with some embodiments of the present disclosure, a device comprises a first array of electrodes; a first plurality of memory strips, each overlapping a column of the first array of electrodes; a first plurality of conductive strips, each overlapping and contacting one of the first plurality of memory strips; a second array of electrodes overlapping the first plurality of conductive strips; a second plurality of memory strips over the second array of electrodes, wherein each of the second plurality of memory strips overlaps a row of the second array of electrodes; and a second plurality of conductive strips, each overlapping one of the second plurality of memory strips. In an embodiment, each of the first plurality of memory strips is a continuous strip formed of a same material, and the continuous strip crosses over and contacts a plurality of electrodes in the first array of electrodes. In an embodiment, each of the second plurality of memory strips is a continuous strip formed of a homogeneous material, and the continuous strip crosses over and contacts a plurality of electrodes in the second array of electrodes. In an embodiment, the first plurality of memory strips comprise state-storage elements of Conductive CBRAMs. In an embodiment, the first plurality of memory strips comprises state-storage elements of PCRAMs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    depositing a first electrode layer;
    depositing a first selector layer over the first electrode layer;
    forming a second electrode layer over the first selector layer;
    performing a first patterning process, wherein the first electrode layer, the first selector layer, and the second electrode layer are patterned as first electrode strips, first selector strips, and second electrode strips, respectively;
    depositing a memory layer over the second electrode strips;
    depositing a third electrode layer over the memory layer; and
    performing a second patterning process, wherein the third electrode layer and the memory layer are patterned as third electrode strips and memory strips, respectively, wherein the second electrode strips and the first selector strips are patterned as a plurality of electrodes and a plurality of selectors, respectively, wherein the plurality of electrodes are laid out as a first electrode array, and wherein the plurality of selectors are laid out as a first selector array, and wherein each of the memory strips overlaps the plurality of selectors in the first selector array.

2. The method of claim 1 further comprising:
after the first patterning process, filling a dielectric region into gaps between the first electrode strips, the first selector strips, and the second electrode strips; and
performing a planarization process, wherein the second electrode strips are used as a polish stop layer in the planarization process.

3. The method of claim 1, wherein each of the plurality of selectors comprises a structure selected from a p-n junction structure, a metal/semiconductor/insulator/semiconductor/ metal structure, and a metal/low-bandgap-dielectric/insulator/low-bandgap-dielectric/metal structure.

4. The method of claim 1 further comprising:
forming a plurality of conductive vias, each overlying and contacting one of the third electrode strips, wherein at a time after the plurality of conductive vias are formed, each of the memory strips is a continuous strip with portions overlapping the plurality of electrodes in the first electrode array.

5. The method of claim 1, wherein the depositing the memory layer comprises depositing a phase change material.

6. The method of claim 1, wherein the depositing the memory layer comprises depositing an oxide.

7. The method of claim 1 further comprising:
before depositing the third electrode layer, depositing a second selector layer, wherein in the second patterning process, the second selector layer is patterned as second selector strips.

8. The method of claim 7 further comprising:
before depositing the third electrode layer, depositing an additional memory layer over the second selector layer;
depositing a fourth electrode layer over the additional memory layer; and
performing a third patterning process, wherein the fourth electrode layer and the additional memory layer are patterned as fourth electrode strips and additional memory strips, respectively.

9. A method comprising:
forming a first plurality of conductive strips having lengthwise directions in a first direction;
forming a first selector array comprising a plurality of selectors, wherein the first selector array overlaps the first plurality of conductive strips;
forming a first electrode array overlapping the first selector array;
forming a first plurality of memory strips over the first electrode array, wherein each of the first plurality of memory strips overlaps the plurality of selectors in the first selector array; and
forming a second plurality of conductive strips overlapping the first plurality of memory strips, wherein the second plurality of conductive strips have lengthwise directions in a second direction perpendicular to the first direction.

10. The method of claim 9, wherein the forming the first plurality of memory strips comprises:
depositing a blanket memory layer; and
performing a first etching process on the blanket memory layer using a first etching mask to form the first plurality of memory strips.

11. The method of claim 10, wherein the forming the second plurality of conductive strips comprises:

depositing a conductive layer; and
patterning the conductive layer to form the second plurality of conductive strips using the first etching mask to define patterns of the second plurality of conductive strips.

12. The method of claim 10, wherein the forming the first selector array comprises:
depositing a blanket selector layer;
patterning the blanket selector layer using a second etching mask to form selector strips; and
patterning the selector strips using the first etching mask to form the first selector array.

13. The method of claim 9, wherein entireties of the first plurality of memory strips are formed of a homogeneous material.

14. The method of claim 13, wherein the homogeneous material is a dielectric material, and the homogeneous material is configured to have conductive filaments formed therein.

15. The method of claim 9, wherein each of the plurality of selectors comprises a structure selected from a p-n junction structure, a metal/semiconductor/insulator/semiconductor/metal structure, and a metal/low-bandgap-dielectric/insulator/low-bandgap-dielectric/metal structure.

16. The method of claim 9, wherein each of the first plurality of memory strips overlaps all selectors in an entire row of the first selector array.

17. The method of claim 9 further comprising:
forming a second selector array overlapping and physically contacting the second plurality of conductive strips;
forming a second electrode array overlapping the second selector array;
forming a second plurality of memory strips over the second electrode array; and
forming a third plurality of conductive strips overlapping the second plurality of memory strips, wherein the second plurality of memory strips and the third plurality of conductive strips have lengthwise directions in the first direction.

18. A method comprising:
depositing a bottom electrode layer;
depositing a selector layer over the bottom electrode layer;
performing a first etching process on the bottom electrode layer and the selector layer to form a plurality of bottom electrode strips and a plurality of selector strips, respectively;
depositing a memory layer over the plurality of selector strips;
depositing a top electrode layer over the memory layer; and
performing a second etching process on the top electrode layer, the memory layer, and the plurality of selector strips to form a plurality of top electrode strips, a plurality of memory strips, and a selector array, respectively.

19. The method of claim 18, wherein the selector layer is deposited over and in physical contact with the bottom electrode layer.

20. The method of claim 18, wherein the second etching process is stopped on the plurality of bottom electrode strips.

* * * * *